(12) United States Patent
Jarikov

(10) Patent No.: US 7,504,163 B2
(45) Date of Patent: *Mar. 17, 2009

(54) HOLE-TRAPPING MATERIALS FOR IMPROVED OLED EFFICIENCY

(75) Inventor: Viktor V. Jarikov, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 434 days.

This patent is subject to a terminal disclaimer.

(21) Appl. No.: 10/889,654

(22) Filed: Jul. 12, 2004

(65) Prior Publication Data

US 2006/0008672 A1    Jan. 12, 2006

(51) Int. Cl.
*H01L 51/50* (2006.01)
(52) U.S. Cl. .................. 428/690; 428/917; 313/504; 313/506
(58) Field of Classification Search ................ 428/690, 428/917, 212; 313/504, 506; 257/102, 103
See application file for complete search history.

(56) References Cited

U.S. PATENT DOCUMENTS

| 4,769,292 | A | 9/1988 | Tang et al. |
| 4,885,211 | A | 12/1989 | Tang et al. |
| 5,141,671 | A | 8/1992 | Bryan et al. |
| 5,281,489 | A | 1/1994 | Mori et al. |
| 5,908,581 | A | 6/1999 | Chen et al. |
| 6,392,339 | B1 | 5/2002 | Aziz et al. |
| 6,459,199 | B1 * | 10/2002 | Kido et al. .............. 313/504 |
| 6,475,648 | B1 | 11/2002 | Hatwar et al. |
| 6,661,023 | B2 * | 12/2003 | Hoag et al. .............. 257/40 |
| 2002/0063517 | A1 * | 5/2002 | Hosokawa .............. 313/504 |
| 2003/0118866 | A1 * | 6/2003 | Oh et al. .............. 428/690 |
| 2004/0058193 | A1 * | 3/2004 | Hatwar .............. 428/690 |
| 2004/0066139 | A1 | 4/2004 | Hamada et al. |

FOREIGN PATENT DOCUMENTS

EP    1 231 252 A2    8/2002

(Continued)

OTHER PUBLICATIONS

Dresner, RCA Review, 30, (1969), p. 322-334.

(Continued)

*Primary Examiner*—Dawn Garrett
(74) *Attorney, Agent, or Firm*—Raymond L. Owens

(57) ABSTRACT

An organic light-emitting device includes a light-emitting layer including a host, a dopant, and a hole-trapping material, wherein the hole-trapping material is provided at 0.01 to less than 5% by volume relative to the light-emitting layer volume, has an oxidation potential that is selected so that it is less than the oxidation potential of the host in order to serve as a hole trap, has an oxidation potential that is selected so as to avoid formation of a certain charge transfer complex between the hole-trapping material and the host if the charge transfer complex causes a reduction in the electroluminescent efficiency of the dopant, and has an oxidation potential that is selected so as to avoid formation of the charge transfer complex between the hole-trapping material and the dopant.

44 Claims, 3 Drawing Sheets

FOREIGN PATENT DOCUMENTS

| | | | |
|---|---|---|---|
| EP | 1 162 674 | B1 | 3/2004 |
| JP | 07-284050 | | 10/1995 |
| JP | 11-273861 | | 10/1999 |
| JP | 2000003787 | A | 1/2000 |
| JP | 2003-257670 | * | 9/2003 |

OTHER PUBLICATIONS

Tang et al., Applied Physics Letters, 51, (1987), p. 913-915.
Tang et al., Journal of Applied Physics, 65, (1989), p. 3610-3616.
Hamada et al., Applied Phys. Lett. 75, (1999), p. 1682-1684.

* cited by examiner

HOLE-TRAPPING MATERIALS FOR IMPROVED OLED EFFICIENCY

FIELD OF THE INVENTION

This invention relates to an electroluminescent (EL) device comprising a light-emitting layer including a host, a dopant, and a hole-trapping material providing improved electroluminescent efficiency and color.

BACKGROUND OF THE INVENTION

Organic light-emitting diodes (OLED), also known as organic electroluminescent (EL) devices, are a class of electronic devices that emit light in response to an electrical current applied to the device. The structure of an OLED device generally includes an anode, an organic EL medium, and a cathode. The term organic EL medium herein refers to organic materials or layers of organic materials disposed between the anode and the cathode in the OLED device. The organic EL medium can include low molecular weight compounds, high molecular weight polymers, oligomers of low molecular weight compounds, or biomaterials in the form of a thin film or a bulk solid. The medium can be amorphous or crystalline. Organic electroluminescent media of various structures have been described in the prior art. Dresner, in RCA Review, 30, 322 (1969), described a medium comprising a single layer of anthracene film. Tang et al., in Applied Physics Letters, 51, 913 (1987), Journal of Applied Physics, 65, 3610 (1989), and commonly assigned U.S. Pat. Nos. 4,769,292 and 4,885,211, report an EL medium with a multilayer structure of organic thin films, and demonstrated highly efficient OLED devices using such a medium. In some OLED device structures, the multilayer EL medium includes a hole-transport layer adjacent to the anode, an electron-transport layer adjacent to the cathode and, disposed in between these two layers, a light-emitting layer. Furthermore, in some preferred device structures, the light-emitting layer is constructed of a doped organic film comprising an organic material as the host and a small concentration of a fluorescent compound as the dopant. Improvements in EL efficiency, chromaticity, and lifetime have been obtained in these doped OLED devices by selecting an appropriate dopant-host composition. The dopant, being the dominant emissive center, is selected to produce the desirable EL colors. Examples of the doped light-emitting layer reported by Tang et al. in commonly assigned U.S. Pat. No. 4,769,292 and by Chen et al. in commonly assigned U.S. Pat. No. 5,908,581 are tris(8-quinolinol)aluminum (AlQ) host doped with coumarin dyes for green emitting OLEDs, and AlQ doped with 4-dicyanomethylene-4H-pyrans (DCMs) for orange-red emitting OLEDs. Shi et al., in commonly assigned U.S. Pat. No. 5,593,788, disclose that improved EL efficiency and color was obtained in an OLED device by using a quinacridone compound as the dopant in an AlQ host. Bryan et al., in commonly assigned U.S. Pat. No. 5,141,671, disclose a light-emitting layer containing perylene or a perylene derivative as a dopant in a blue emitting host. They showed that a blue emitting OLED device with an improved EL efficiency was obtained. In both disclosures, the incorporation of selected fluorescent dopants in the light-emitting layer is found to improve substantially the overall OLED device performance parameters. Co-doping of light-emitting layer with anthracene derivatives results in devices with better EL efficiency as shown in JP 11-273861 and JP 07-284050.

The most common formulation of the doped light-emitting layer includes only a single dopant in a host matrix. However, in a few instances, incorporation of more than one dopant in the light-emitting layer was found to be beneficial in improving EL efficiency. Using a light-emitting layer containing rubrene, a yellow emitting dopant, and DCJ, 4-(dicyanomethylene)-2-methyl-6-[2-(4-julolidyl)ethenyl]-4H-pyran, and a red emitting dopant in an AlQ host, it is possible to produce a red emitting OLED device with improved EL efficiency and color; see Hamada et al. in Applied Phys. Lett. 75, 1682 (1999), and EP 1 162 674 B1. Here rubrene functions as a co-dopant in mediating energy transfer from the AlQ host to the DCJ emitter.

Doping light-emitting layers with materials that are primarily hole-transporting compounds having the function of assisting in transportation of the charge carriers (holes) to improve luminous efficiency has been described, for example, by Mori et al. in commonly assigned U.S. Pat. No. 5,281,489, by Aziz et al. in commonly assigned U.S. Pat. No. 6,392,339, by Hatwar et al. in commonly assigned U.S. Pat. No. 6,475,648, and by Matsuo et al. in EP 1 231 252 A2. These references disclose that high concentrations of hole-trapping materials, for example 50% or more, are required to provide the reported operational improvements. It has been disclosed by Hamada et al. in U.S. patent application Publication 2004/0066139 A1 that the hole-transporting materials present in a light-emitting layer at concentrations less than 5% cannot satisfactorily function as an auxiliary dopant.

Luminous efficiency of OLED devices remains a factor limiting possible OLED applications and competitiveness. Developing advanced materials and device configurations play an important role. It has been observed that use of different materials in OLEDs, most critically hosts and dopants in light-emitting layers, leads to different device performance parameters, the most basic of which are drive voltage, CIE coordinates, electroluminescence (EL) efficiency, and operational lifetime.

Although EL efficiency and color have been improved significantly using doped light-emitting layers of various compositions, the problem of insufficient EL efficiency persists. Insufficient luminous efficiency presents an obstacle for many desirable practical applications.

SUMMARY OF THE INVENTION

It is an object of the present invention to provide efficient OLED devices producing visible light with significantly improved luminance yield and improved color coordinates.

This object is achieved by an organic light-emitting device comprising a light-emitting layer including a host, a dopant, and a hole-trapping material, wherein the hole-trapping material is provided at 0.01 to less than 5% by volume relative to the light-emitting layer volume, has an oxidation potential that is selected so that it is less than the oxidation potential of the host in order to serve as a hole trap, has an oxidation potential that is selected so as to avoid formation of a certain charge transfer complex between the hole-trapping material and the host if the charge transfer complex causes a reduction in the electroluminescent efficiency of the dopant, and has an oxidation potential that is selected so as to avoid formation of the charge transfer complex between the hole-trapping material and the dopant.

The present invention provides an electroluminescent device comprising a cathode and an anode, and between which a layer is disposed containing a host, a dopant, and a hole-transporting or hole-trapping material. The present invention also can be used in display devices or area lighting devices incorporating the electroluminescent device and a process for emitting light. The present invention is applicable to the electroluminescent devices of all colors.

BRIEF DESCRIPTION OF THE DRAWINGS

The drawings are necessarily of a schematic nature, since the individual layers are too thin and the thickness differences of the various elements too great to permit depiction to scale or to permit convenient proportionate scaling.

DETAILED DESCRIPTION OF THE INVENTION

Figure 1:
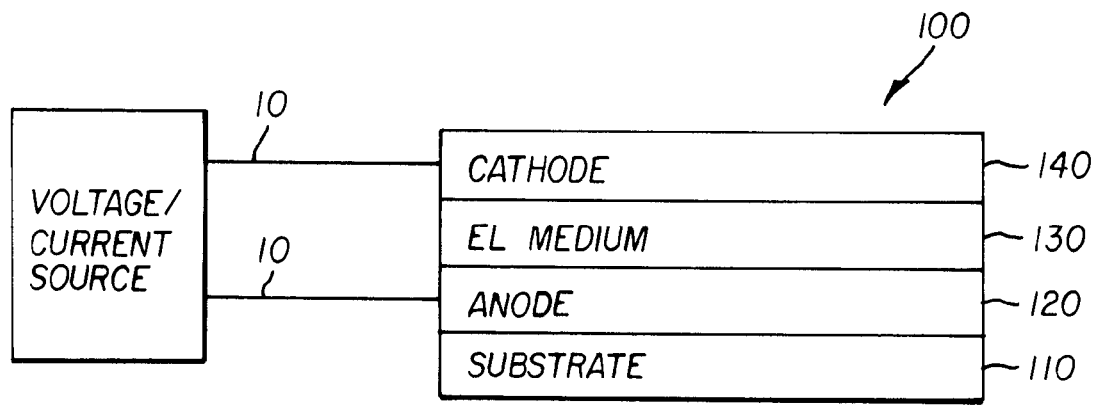
FIG. 1 is schematic structure of an OLED with an organic EL medium.

FIG. 1 illustrates the structure of an OLED device of the simplest construction practiced in the present invention. In this structure, OLED device 100 includes an anode 120, an EL medium 130, and a cathode 140 disposed upon a substrate 110. In operation, an electrical current is passed through the OLED by connecting an external current or voltage source with electrical conductors 10 to the anode 120 and the cathode 140, causing light to be emitted from the EL medium. The light can exit through either the anode 120 or the cathode 140, or both, as desired and depending on their optical transparencies. The EL medium includes a single layer or a multilayer of organic materials.

Figure 2:
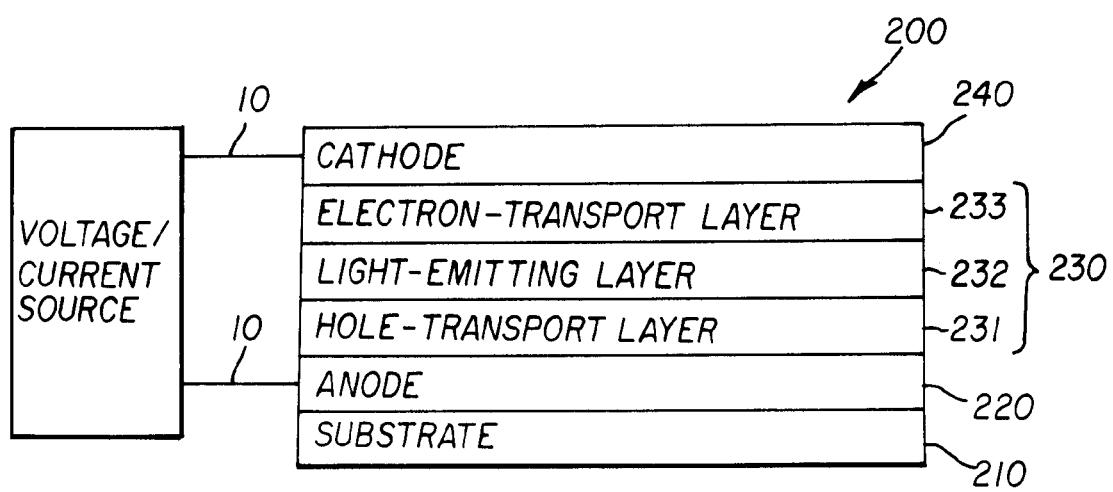
FIG. 2 and FIG. 3 are two schematic OLED structures showing two different configurations of the organic EL medium.

FIG. 2 illustrates the structure of another OLED device of the present invention. In this structure, OLED device 200 includes a substrate 210 and an EL medium 230 disposed between anode 220 and cathode 240. EL medium 230 includes a hole-transport layer 231 adjacent to the anode, an electron-transport layer 233 adjacent to the cathode, and a light-emitting layer 232 disposed between the hole-transport layer and the electron-transport layer. In operation, an electrical current is passed through the OLED device by connecting an external current or voltage source with electrical conductors 10 to the anode and the cathode. This electrical current, passing through the EL medium, causes light to be emitted primarily from the light-emitting layer 232. Hole-transport layer 231 carries the holes, that is, positive electronic charge carriers, from the anode to the light-emitting layer. Electron-transport layer 233 carries the electrons, that is, negative electronic charge carriers, from the cathode to the light-emitting layer 232. The recombination of holes and electrons produces light emission, that is, electroluminescence, from the light-emitting layer 232.

Figure 3:
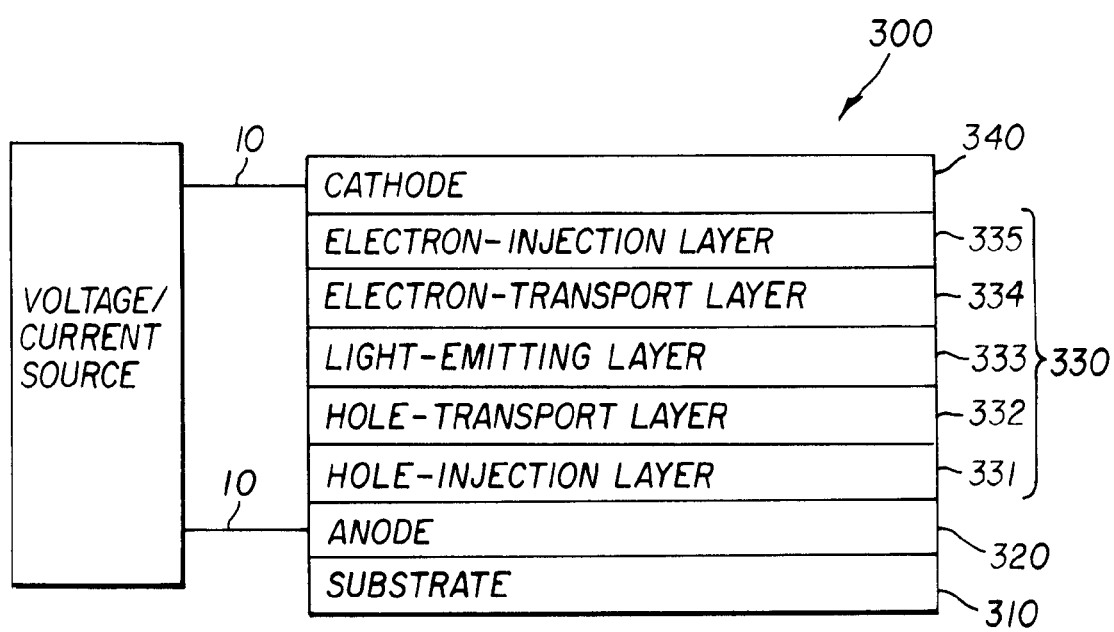

FIG. 3 illustrates yet another structure of an OLED device of the present invention. In this structure, OLED device 300 includes a substrate 310 and an EL medium 330 disposed between anode 320 and cathode 340. EL medium 330 includes a hole-injection layer 331, a hole-transport layer 332, a light-emitting layer 333, an electron-transport layer 334, and an electron-injection layer 335. Similar to the OLED device 200 of FIG. 2, the recombination of electrons and holes produces emission primarily from the light-emitting layer 333. The provision of the hole-injection layer 331 and the electron-injection layer 335 serves to reduce the barriers for carrier injection from the respective electrodes. Consequently, the drive voltage required for the OLED device can be reduced.

Figure 4:
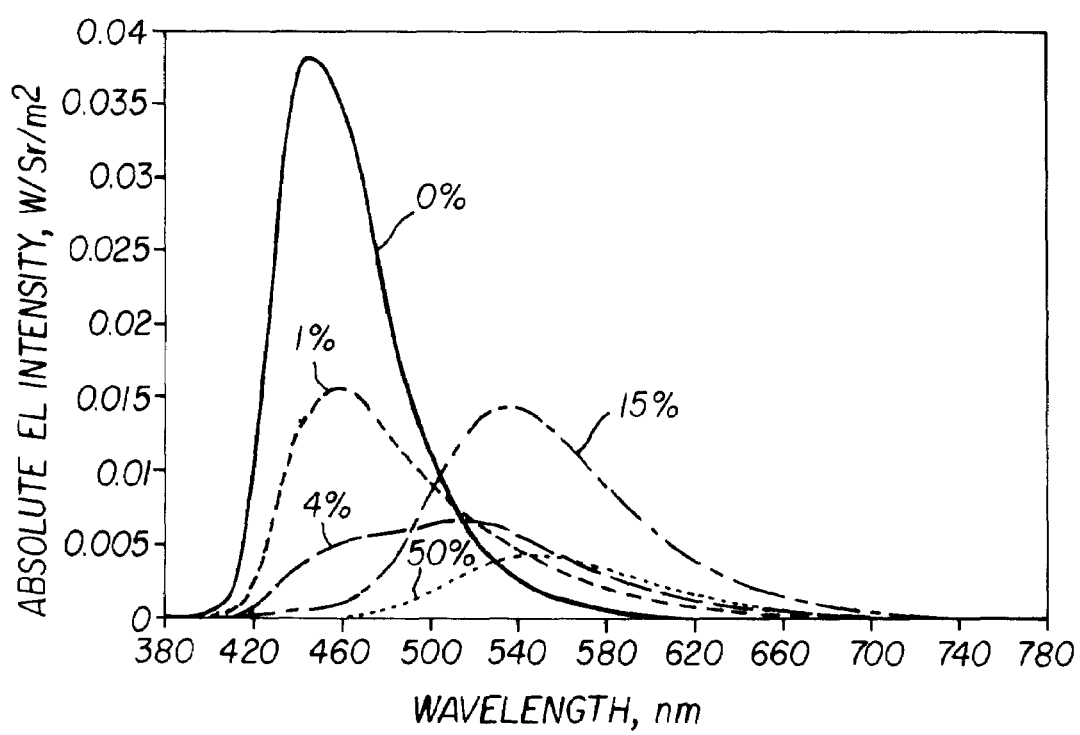
FIG. 4 is a graphical depiction of the absolute EL spectra for TBADN+mTDATA devices of Examples 11a-11d.

FIG. 4 shows for Examples 11a-11d the absolute EL spectra for TBADN+mTDATA devices at 20 mA/cm$^2$. This figure illustrates the formation of the emissive charge transfer complex, which causes change in the electroluminescent color.

According to the present invention, the light-emitting layer (either layer 232 of FIG. 2 or layer 333 of FIG. 3) is primarily responsible for the electroluminescence emitted from the OLED device. One of the most commonly used formulations for this light-emitting layer is an organic thin film including a host and one or more dopants. The host serves as the solid medium or matrix for the transport and recombination of charge carriers injected from the hole-transporting layer and the electron-transporting layer. The dopant, usually homogeneously distributed in the host in small quantity, provides the emission centers where excitons are collected and light is produced. Expanding the teaching of the prior art, the present invention uses a light-emitting layer including a host and a dopant and a hole-trapping material, and it distinguishes over the prior art that addition of the hole-trapping material to the light-emitting layer at concentrations less than 5% provides significant increases in electroluminescent efficiency. Another distinguishing feature of the present invention over the prior art is that it relates to the light-emitting layers of all colors, from violet to deep red. Another distinguishing feature of the present invention over the prior art is that it provides a range for practically useful Highest Occupied Molecular Orbital (HOMO) levels or oxidation potentials. The selection of these host, dopant, and hole-trapping materials is in accordance with the following criteria:

1. The host is an organic compound that forms thin, pinhole free, and continuous solid films and is capable of carrying both hole and electron current, injected from the hole-transporting and electron-transporting layers, respectively;

2. The dopant is an organic compound that is highly luminescent and provides the emission centers where excitons are collected and light is produced;

3. The hole-trapping material is an organic compound whose oxidation potential is lower (or HOMO level is higher) than that for the host;

4. If the electroluminescent color of the inventive OLED device is intended to be blue or blue-green, the oxidation potential of the hole-trapping material should not be so low as to cause formation of a certain undesirable charge transfer complex between the hole-trapping additive and the host. If the electronic energy for the first singlet excited state of such charge-transfer complex is lower than that for the dopant, the charge transfer complex would reduce the electroluminescence efficiency of the dopant, and if the charge transfer complex is emissive then the electroluminescent color changes;

5. If the electroluminescent color of the inventive OLED device is intended to be green, yellow, orange or red and, thus, a dopant of appropriate emission color is chosen, the oxidation potential of the hole-trapping material may be so low as to cause formation of a certain charge transfer complex between the hole-trapping additive and the host. However, the electronic energy for the first singlet excited state of such charge-transfer complex should be higher than that for the dopant, and the said charge-transfer complex should be able to efficiently donate electronic excitation energy to the dopant, so that the charge transfer complex would not reduce the electroluminescence efficiency of the dopant and the electroluminescent efficiency of the device would still be improved;

6. For OLED devices of any color, the oxidation potential of the hole-trapping material should not be so low as to cause formation of an undesirable charge transfer complex between the hole-trapping additive and the dopant, which would reduce the electroluminescence efficiency of the dopant;

7. The bandgap of the hole-trapping material should be larger than that for the dopant, otherwise the hole-trapping material would reduce the electroluminescent efficiency of the dopant; and 8. The hole-trapping material should be able to efficiently donate electronic excitation energy to the dopant.

Electrochemical oxidation potentials can be measured by known procedures to those skilled in the art, for example, as described by J. Wang in *Analytical Electrochemistry, 2$^{nd}$ Edition*, 2000, Wiley-VCH, or for OLED materials as described by C. Schmitz, H. Schmidt, and H. W. Thelakkat in *Chem. Mat.* 2000, 12, 3012-3019. For example, in accordance with the requirements of this invention, the oxidation potential for a hole-trapping material of the triarylamine group of compounds should be in a range of from +0.4 to +1.5 V vs. SCE (saturated calomel electrode) for the hole-trapping material to be useful in OLEDs of any color using wide bandgap materials with oxidation potential as low as +1.6 V as hosts. Furthermore, the preferable range is +0.6 to +1.1 V vs. SCE for the hole-trapping material, in particular amine, to be useful in blue and blue-green OLEDs using anthracene derivatives, in particular hydrocarbon 9,10-disubstituted anthracenes, with oxidation potential +1.2 V or higher as hosts. For green and red OLEDs, the low limit of the oxidation potential range for an amine additive can be lowered to +0.4 V and +0.2 V, respectively.

In accordance with this invention, a charge transfer complex can be understood as an electron donor—acceptor complex, whose physical and chemical properties are different from those for the separate components that come together to form the complex, and in which there is a donor molecule and an acceptor molecule as described by J. March and M. B. Smith in *Advanced Organic Chemistry*, 5$^{th}$ Ed., pp. 102-104, 2001, John Wiley & Sons. The donor can donate an unshared pair or pair of electrons in an orbital of a double bond or aromatic system. One test for the presence of a charge transfer complex is the electronic spectrum. The complex generally exhibits a spectrum (called a charge transfer spectrum) that is not the same as the sum of the spectra of the two individual components. In most charge transfer complexes, the donor and acceptor molecules are present in an integral ratio, most often 1:1, but complexes with nonintegral ratios are also known. In accordance with this invention for the cases of blue and blue-green OLEDs, the electronic spectrum of the mixture of hole-trapping material, host and dopant is identical to the sum of the individual components, thus indicating an avoidance of a charge transfer complex between the hole-trapping additive and the principal host, or dopant, which would quench the electroluminescence efficiency of the dopant. However, for green, yellow, orange, red, and white OLEDs, formation of the charge transfer complex between the host and the hole-trapping material is allowable as long as (i) the electronic energy for the first singlet excited state of the complex is higher than that for the dopant, and (ii) the complex is able to donate its excitation energy to the dopant (for example, the complex should be luminescent, that is have a substantial quantum yield of luminescence). This would ensure that the emission color of the light-emitting layer and its EL efficiency are characteristic of the dopant.

Following the selection criteria of this invention, OLED devices have been constructed having excellent EL efficiency. Thus, it has been discovered that addition of certain compounds, which are capable of trapping holes, to a blue light-emitting layer provided significant increases in electroluminescent efficiency. Further, addition of the hole-trapping material at concentrations of less than 5% to a blue emission layer comprised of a host and a dopant resulted in an improvement in current efficiency by a factor of 1.3 to 2 times. Also, it has been discovered that the current efficiency can be further improved by employing known in the art dual hole-transporting layers, that is hole-transporting layers including at least two sublayers made of two compounds having different oxidation potentials. Also, it has been discovered that the current efficiency can be further improved by employing known in the art doping with an alkali metal in an electron-transporting layer. It has been further discovered that addition of the hole-trapping material to a blue-green light-emitting layer comprised of host and a dopant also results in a 1.1-1.4 times increase in EL efficiency when the dopant belongs to a known in the art class of strylylamines. With the blue-green luminescent dopants, which are themselves not able to trap holes, the increase in EL efficiency upon addition of the hole-trapping material should be again 1.3-2 times.

The hole-trapping material additives to a light emission layer comprising a host and a dopant which embody this invention include the class of amines and more specifically include the classes of mono-, di-, and triarylamines, mixed alkyl(aryl)amines, mono-, di, and trialkylamines, aminobenzenes, styrylamines, bis-styrylamines, aminoanthracenes, aminotetraphenes, amino-oligophenylenes, aminofluorenes, aminocoronenes, aminotriphenylenes, aminophenanthrenes, aminonaphthalenes, aminochrysenes, aminofluoranthenes, aminopyrenes, aminoperylenes, and aminotetracenes. It is understood that the energy for the appropriate electronically excited state of an amine should be higher than that for the fluorescent or phosphorescent dopant. It is also to be understood that other hole-trapping materials, for example, silicon atom containing compounds, phosphorous atom containing compounds, oxygen atom containing compounds, and sulfur atom containing compounds, can be combined with a host and a dopant in the same manner as amines to impart improved efficiency as described in this invention, as long as they satisfy the abovementioned criteria of hole-trapping and proper excitation energy cascade that ensures exciton placement on the luminescent dopant. Thus, for example, it is contemplated that the hole-trapping material for a blue or blue-green light-emitting layer containing a host with oxidation potential +1.2 V or higher comprises:

i) an alkyl, alkoxy, aryl, or aryloxy derivative of pyrrole with oxidation potential, in a range of from +0.5 to +1.2 V vs. SCE;

ii) a mono or poly-substituted alkoxy or aryloxy derivative of a hydrocarbon aromatic compound with oxidation potential in a range of from +0.5 to +1.2 V vs. SCE;

iii) an alkyl, alkoxy, aryl, or aryloxy derivative of furan with oxidation potential in a range of from +0.5 to +1.2 V vs. SCE;

iv) an alkyl or aryl derivative of silane with oxidation potential in a range of from +0.5 to +1.2 V vs. SCE;

v) an alkyl or aryl derivative of phosphine with oxidation potential in a range of from +0.5 to +1.2 V vs. SCE;

vi) an alkylsulfide or arylsulfide with oxidation potential in a range of from +0.5 to +1.2 V vs. SCE; or vii) or an alkyl, alkoxy, aryl, or aryloxy derivative of thiophene with oxidation potential in a range of from +0.5 to +1.2 V vs. SCE.

A class of materials useful as the hole-trapping materials includes structures having an amine moiety. Exemplary of contemplated amino compounds are those satisfying the following structural formula:

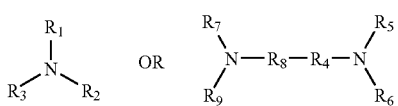

wherein:

substituents $R_4$ and $R_8$ are each individually and independently aryl, or substituted aryl of from 5 to 30 carbon atoms, heterocycle containing at least one nitrogen atom, or at least one oxygen atom, or at least one sulfur atom, or at least one boron atom, or at least one phosphorus atom, or at least one silicon atom, or any combination thereof; substituents $R_4$ $_{and}$ $_{R8}$ each or together ("$R_4$—$R_8$") representing an aryl group such as benzene, naphthalene, anthracene, tetracene, pyrene, perylene, chrysene, phenathrene, triphenylene, tetraphene, coronene, fluoranthene, pentaphene, ovalene, picene, anthanthrene and their homologs and also their 1,2-benzo, 1,2-naphtho, 2,3-naphtho, 1,8-naphtho, 1,2-anthraceno, 2,3-anthraceno, 2,2'-biphenylene (2,2'-BP), 4,5-phenanthreno (4,5-PhAn), 1,12-triphenyleno (1,12-TriP), 1,12-peryleno (1,12-Per), 9,10-phenanthreno (9,10-PhAn), 1,9-anthraceno (1,9-An), 1,10-phenanthreno (1,10-PhAn), 2,3-phenanthreno (2,3-PhAn), 1,2-phenanthreno (1,2-PhAn), 1,10-pyreno (1,10-Pyr), 1,2-pyreno (1,2-Pyr), 2,3-peryleno (2.3-Per), 3,4-fluorantheno (3,4-FlAn), 2,3-fluorantheno (2,3-FlAn), 1,2-fluorantheno (1,2-FlAn), 3,4-peryleno (3,4-Per), 7,8- fluorantheno (7,8-FlAn, 8,9-fluorantheno (8,9-FlAn), 2,3-triphenyleno (2,3-TriP), 1,2-triphenyleno (1,2-TriP),

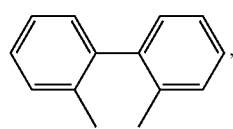

2,2'-BP

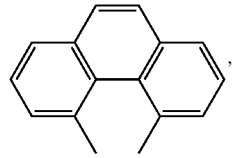

4,5-PhAn

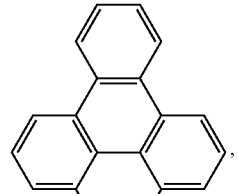

1,12-TriP

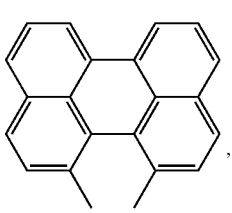

1,12-Per

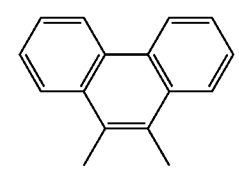

9,10-PhAn

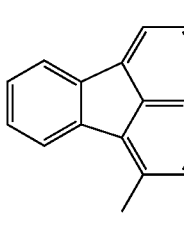

1,9-An

-continued

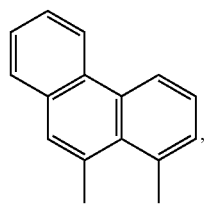

1,10-PhAn

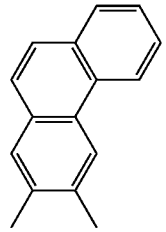

2,3-PhAn

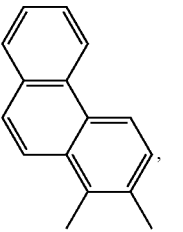

1,1-PhAn

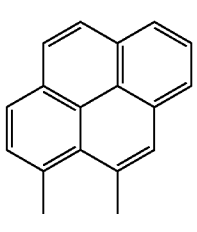

1,10-Pyr

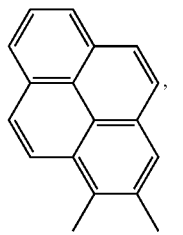

1,2-Pyr

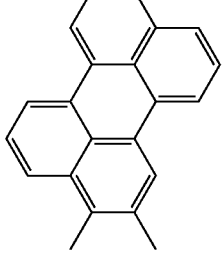

2,3-Per

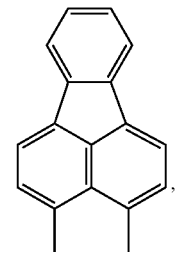

3,4-FlAn

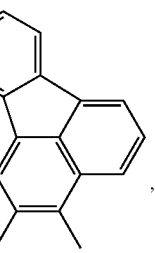

2,3-FlAn

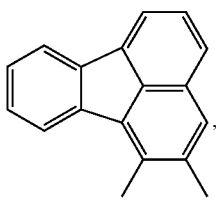

1,2-FlAn

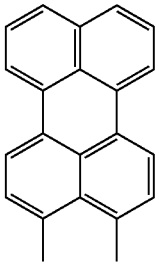

3,4-Per

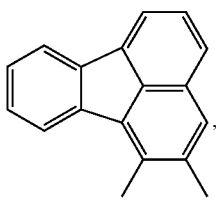

7,8-FlAn

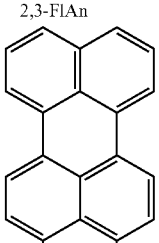

8,9-FlAn

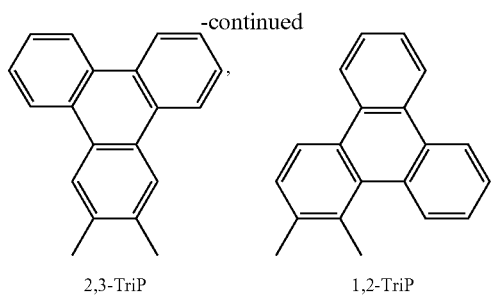

2,3-TriP    1,2-TriP (where bonds that do not form a cycle indicate points of attachment), or ace, or indeno substituted derivatives; and substituents $R_1$ through $R_9$ excluding $R_4$ and $R_8$ are each individually hydrogen, silyl, alkyl of from 1 to 24 carbon atoms, substituted alkyl, aryl of from 5 to 30 carbon atoms, substituted aryl, fluorine or chlorine, heterocycle containing at least one nitrogen atom, or at least one oxygen atom, or at least one sulfur atom, or at least one boron atom, or at least one phosphorus atom, or at least one silicon atom, or any combination thereof.

Illustrative of useful amino compounds and their abbreviated names are the following:

N,N'-bis(1-naphthalenyl)-N,N'-diphenylbenzidine (NPB);
N,N'-bis(1-naphthalenyl)-N,N'-bis(2-naphthalenyl)benzidine (TNB);
N,N'-bis(3-methylphenyl)-N,N'-diphenylbenzidine (TPD);
N,N'-Bis(N'',N'''-diphenylaminonaphthalen-5-yl)-N,N'-diphenyl-1,5-diaminonaphthalene (CAS 503624-47-3);
Triphenylamine (HTMA1);
9-Phenylcarbazole (HTMA2);
N,N'-Bis(4-methylphenylamine)-N,N'-diphenyl-1,4-phenylenediamine;
4,4'-Bis(carbazol-9-yl)biphenyl (CAS 58328-31-7);
N,N'-Diphenyl-N,N'-di(m-tolyl)benzidine (CAS 65181-78-4);
4,4'-Dimethyltriphenylamine (CAS 20440-95-3);
N,N-Diphenylbenzidine (CAS 531-91-9);
N,N,N',N'-Tetraphenylbenzidine (CAS 15546-43-7);
4-(2,2-Diphenylethen-1-yl)triphenylamine (CAS 89114-90-9);
3-Methyltriphenylamine(CAS 4316-54-5);
N-(Biphenyl-4-yl)-N-(m-tolyl)aniline (CAS 154576-20-2);
Tri-p-tolylamine (CAS 1159-53-1);
Tris(p-aminophenyl)amine (CAS 5981-09-9);
N,N,N',N'-Tetrakis(4-methylphenyl)benzidine (CAS 161485-60-5);
N,N'-Bis(4-methylphenyl)-N,N'-bis(phenyl)benzidien (CAS 20441-06-9);
5,10-Dihydro-5,10-dimethyl-phenazine;
9,14-Dihydro-9,14-dimethyl-dibenzo[a,c]phenazine;
9,14-Dihydro-9,14-dimethyl-phenanthro[4,5-abc]phenazine;
6,13-Dimethyldibenzo[b,i]phenazine;
5,10-Dihydro-5,10-diphenylphenazine;
4,4',4''-Tris(N-3-methylphenyl-N-phenyl-amino)-triphenylamine (CAS 124729-98-2);
4-Aminophenyldiphenylamine (CAS 2350-01-8);
N,N',N'',N'''-Tetrakis(3-methylphenyl)-benzidine (CAS 106614-54-4);
4,4',4''-Tris(N-(2-naphthyl)-N-phenylamino)-triphenylamine (CAS 185690-41-9);
N,N'-Di(naphthalene-1-yl)-N,N'-di(4-methylphenyl)-benzidine (CAS 214341-85-2);
N,N'-Di(naphthalene-2-yl)-N,N'-di(3-methylphenyl)benzidine (CAS 178924-17-9);
N,N'-Bis(4-methylphenyl)-N,N'-bis(phenyl)-1,4-phenylenediamine (CAS 138171-14-9);
1,1-Bis(4-bis(4-methylphenyl)aminophenyl)-cyclohexane (CAS 58473-78-2);
4,4',4''-Tris(N,N-diphenylamino)-triphenylamine (CAS 105389-36-4);
4,4',4''-Tris(N-(1-naphthyl)-N-phenylamino)triphenylamine (CAS 185690-39-5);
N,N,N',N'-Tetrakis(4-dibutylaminophenyl)-p-phenylenediamine (CAS 4182-80-3);
N,N,N',N'-Tetrakis(naphthyl-2-yl)benzidine (CAS 141752-82-1);
N,N'-Bis(phenanthren-9-yl)-N,N'-diphenylbenzidine (CAS 141752-82-1);
N,N'-Bis(2-naphthalenyl)-N,N'-diphenylbenzidine (CAS 123847-85-8);
4,4',4''-Tris(carbazol-9-yl)triphenylamine (CAS 139092-78-7);
N,N'-Bis(4-(2,2-diphenylethen-1-yl)phenyl)-N,N'-bis(phenyl)benzidine (CAS 218598-81-3);
N,N'-Bis(4-(2,2-diphenylethen-1-yl)phenyl)-N,N'-bis(4-methylphenyl)benzidine (CAS 263746-29-8);
N,N'-Bis(phenyl)-N,N'-bis(4'-(N,N-bis(naphth-1-yl)amino)biphenyl-4-yl)benzidine;
N,N'-Bis(phenyl)-N,N'-bis(4'-(N,N-bis(phenylamino)biphenyl-4-yl)benzidine (CAS 167218-46-4);
Alpha Naphthylphenylbenzidine;
Tris[(4-diethylamino)phenyl]amine (CAS 47743-70-4);
1,1-Bis[4-[N,N-di(p-tolyl)amino]phenyl]cyclohexane (CAS 58473-78-2);
1,4-Bis[2-[4-[N,N-di(p-tolyl)amino]phenyl]vinyl]benzene (CAS 55035-43-3);
4,4'-Bis[di(3,5-xylyl)amino]-4''-phenyltriphenylamine (CAS 249609-49-2);
1,3,5-Tri(9H-carbazol-9-yl)benzene (CAS 148044-07-9);
Tris(4-biphenylyl)amine (CAS 6543-20-0);
1,1-Bis(4-di-p-tolylaminophenyl)-4-phenylcyclohexane;
4,4'-Bis(diphenylamino)quadriphenyl;
Bis(4-dimethylamino-2-methylphenyl)phenylmethane;
4-(Di-p-tolylamino)-4'-[4-(di-p-tolylamino)styryl]stilbene;
Poly(N-vinylcarbazole);
4,4'-Bis[N-(1-naphthyl)-N-phenylamino]-p-terphenyl;
4,4'-Bis[N-(3-acenaphthenyl)-N-phenylamino]biphenyl;
4,4'-Bis[N-(9-anthryl)-N-phenylamino]biphenyl;
4,4'-Bis[N-(1-anthryl)-N-phenylamino]biphenyl;
4,4'-Bis[N-(2-perylenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4'-diamino-p-terphenyl;
4,4'-Bis[N-phenyl-N-(2-pyrenyl)amino]biphenyl;
2,6-Bis[N,N-di(2-naphthyl)amine]fluorine;
1,5-Bis[N-(1-naphthyl)-N-phenylamino]naphthalene;
7-Phenyl-7H-benz[k,l]acridine;
2,3,6,7-Tetrahydronaphtho[1,2,3-ij]quinolizine;
2,3,5,6,7,11,12,14,15,16-Decahydro-1H, 10H-anthra[1,2,3-ij:5,6,7-l'j']diquinolizine;
N,N,N',N'-Tetraphenylbenzo[x,y,z]heptaphene-6,9-diamine;
N,N'-Diphenylbenzo[x,y,z]heptaphene-6,9-diamine;
N,N'-Di-1-coronenyl-N,N'-diphenyl-[1,1'-biphenyl]-4,4'-diamine;
N,N',N''-Tris[4-[2,2-bis(4-methylphenyl)ethenyl]phenyl]-N,N',N''-tris(4-methylphenyl)-2,6,10-triphenylenetriamine;
4,4'-(6,12-Chrysenediyl)bis[N,N-bis(4-methylphenyl)]benzenamine;

N,N,N',N'-Tetra-2-naphthalenyl-6,12-chrysenediamine;
N,N'-Bis[4-(1,1-dimethylethyl)phenyl]-N,N'-diphenyl-6,12-chrysenediamine;
4,4'-(5,11-Chrysenediyldi-2,1-ethenediyl)bis[N,N-diphenylbenzenamine];
N-(7,10-Diphenyl-3-fluoranthenyl)-N,7,10-triphenyl-3-fluoranthenamine;
N,N'-Bis[4-[2,2-bis(4-methylphenyl)ethenyl]phenyl]-N,N'-bis(4-methylphenyl)-3,8-fluoranthenediamine;
8-(9H-Carbazol-9-yl)-N,N-diphenyl-3-fluoranthenamine;
N,N-Bis(4-methylphenyl)-2-pyrenamine;
3-(1-Pyrenyl)-N,N-bis[3-(1-pyrenyl)phenyl]-benzenamine;
N,N'-[(9,9-Dimethyl-9H-fluorene-2,7-diyl)di-4,1-phenylene]bis[N-[4-(1,1-dimethylethyl)phenyl]-1-pyrenamine;
N,N-Bis([1,1'-biphenyl]-4-yl)-6,12-bis(1,1-dimethylethyl)-3-perylenamine;
N-[1,1'-Biphenyl]-3-yl-N-3-perylenyl-3-perylenamine;
N,N'-Di-2-naphthalenyl-N,N'-diphenyl-3,10-perylenediamine;
N,N'-(1,4-Naphthalenediyl-di-4,1-phenylene)bis[N-phenyl-3-perylenamine];
N-[4-(Diphenylamino)phenyl]-N-2-naphthacenyl-N',N'-diphenyl-1,4-benzenediamine;
N-1-Naphthacenyl-N'-1-naphthalenyl-N-[4-(1-naphthalenylphenylamino)phenyl]-N'-phenyl-1,4-benzenediamine;
N-5-Naphthacenyl-N'-1-naphthalenyl-N-[4-(1-naphthalenylphenyl-amino)phenyl]-N'-phenyl-1,4-benzenediamine;
N,N'-Diphenyl-N,N'-di-1H-pyrrol-2-yl-[1,1'-biphenyl]-4,4'-diamine;
Tris[4-(pyrrol-1-yl)phenyl]amine;
4,4'-[(1-Ethyl-1H-pyrrole-2,5-diyl)bis(4,1-phenylene-2,1-ethenediyl)]bis[N,N-diphenyl-benzenamine];
4-[2-(4-Methylphenyl)-2-(1H-pyrrol-2-yl)ethenyl]-N,N-bis[4-[2-(4-methylphenyl)-2-(1H-pyrrol-2-yl)ethenyl]phenyl]benzenamine;
N,N,N',N'-Tetrakis(4-methoxyphenyl)-3,10-perylenediamine,
N,N,N',N',N'',N'',N''',N'''-Octakis(4-methoxyphenyl)-1,4,7,10-perylenetetramine;
N-1-Naphthalenyl-N-[4'-(trifluoromethoxy)[1,1'-biphenyl]-2-yl]-3-perylenamine;
4,4'-(1,4-Naphthalenediyl-di-2,1-ethenediyl)bis[N-(4-methoxyphenyl)-N-phenyl-benzenamine;
N,N'-(Oxydi-4,1-phenylene)bis[N-methyl-3-perylenamine];
N-[4-(Diphenylamino)phenyl]-N-(12-ethoxy-5-naphthacenyl)-N',N'-diphenyl-1,4-benzenediamine;
N,N-Bis(4-phenoxyphenyl)-1-naphthacenamine;
2,2'-(1,4-Phenylene)bis[3-methoxy-N-9-phenanthrenyl-N-phenyl-6-benzofuranamine;
2,2'-(1,4-Phenylene)bis[N-1-naphthalenyl-N-phenyl-3-(trifluoromethyl)-6-benzofuranamine;
2,2'-(9,10-Anthracenediyl)bis[N-(3-methylphenyl)-N-phenyl-6-benzofuranamine;
N,N'-Diphenyl-N,N'-bis[4-(3-phenyl-2-benzofuranyl)phenyl]-[1,1'-biphenyl]-4,4'-diamine;
N,N'-bis[4'-[[8-[bis(2,4-dimethylphenyl)amino]-2-dibenzofuranyl](4-methylphenyl)amino][1,1'-biphenyl]-4-yl]-N,N'-bis(4-methylphenyl)-2,8-dibenzofurandiamine;
2,2'-(1,4-Phenylene)bis[N,N-diphenyl-6-benzofuranamine;
N-2-Benzofuranyl-N'-[4-(2-benzofuranylphenylamino)phenyl]-N'-3-perylenyl-N-phenyl-1,4-benzenediamine;
N,N-Bis[4-(dimethylphenylsilyl)phenyl]-3-perylenamine;
4-(Triphenylsilyl)-N,N-bis[4-(triphenylsilyl)phenyl]-benzenamine;
4-(Dimethylphenylsilyl)-N,N-bis[4-(dimethylphenylsilyl)phenyl]-benzenamine;
N,N-Bis[4-(dimethyl-2-naphthalenylsilyl)phenyl]-4-ethoxy-benzenamine;
4,4'-(9,10-Anthracenediyl)bis[N,N-bis[4-(methyldiphenylsilyl)phenyl]-benzenamine;
N,N-Bis[4'-[bis[4-(methyldiphenylsilyl)phenyl]amino][1,1'-biphenyl]-4-yl]-N',N'-bis[4-(methyldiphenylsilyl)phenyl]-[1,1'-biphenyl]-4,4'-diamine;
N,N,N',N'-Tetrakis[4-(diphenylphosphino)phenyl]-[1,1'-biphenyl]-4,4'-diamine;
4,4'-(9,10-Anthracenediyl)bis[N,N-bis[4-[bis(4-methylphenyl)-phosphino]phenyl]-benzenamine;
4,4'-(9,10-anthracenediyl)bis[N,N-bis[4-(diphenylphosphinyl)phenyl]-benzenamine; or
4,4'-(9,10-Anthracenediyl)bis[N,N-bis[4-(diphenylphosphino)phenyl]-benzenamine.

An illustrative class of materials useful as the hole-trapping materials includes structures having an alkyl or aryl moiety containing a sulfur atom or atoms including the following:
4,4'-(1E)-1,2-Ethenediylbis[N,N-bis[4-[(1E)-2-[4-[bis[4-(butylthio)phenyl]amino]phenyl]ethenyl]phenyl]-benzenamine;
N,N-Bis[3-[[3-(diphenylamino)phenyl]thio]phenyl]-3-perylenamine;
3,4,9,10-Tetraphenyl-N,N,N',N'-tetrakis[4-(phenylsulfonyl)phenyl]-1,7-perylenediamine;
4,4'-(1,2-Ethenediyl)bis[N,N-bis[4-(phenylthio)phenyl]-1-naphthalenamine;
6,11-Dimethyl-N,N-bis[4-(phenylsulfonyl)phenyl]-2-naphthacenamine;
N,N-Bis[4-(phenylthio)phenyl]-2-naphthacenamine;
10,10'-(2,5-Thiophenediyl)bis[N,N-bis[4-(phenylsulfonyl)phenyl]-9-anthracenamine;
2,2'-(1,4-phenylene)bis[N-1-naphthalenyl-N-phenyl-benzo[b]thiophen-6-amine;
N,N-Bis[4-(2-thienyl)phenyl]-3-perylenamine;
5-[4-(Diphenylamino)phenyl]-N-[5-[4-(diphenylamino)phenyl]-2-thienyl]-N-3-perylenyl-2-thiophenamine;
N-3-perylenyl-5-phenyl-N-(5-phenyl-2-thienyl)-2-thiophenamine; or
N-[2,2'-Bithiophen]-5-yl-N-3-perylenyl-[2,2'-bithiophen]-5-amine.

Another illustrative class of materials useful as the hole-trapping materials includes structures having a pyrrole moiety including the following: 2-[4-(8-Fluoranthenyl)-3-(9-phenanthrenyl)phenyl]-1-phenyl-1H-pyrrole, or 2-(3,4-Di-9-phenanthrenylphenyl)-1H-pyrrole.

Another illustrative class of materials useful as the hole-trapping materials includes structures having an aryloxy-or alkoxy-substituted moiety including the following:
1,2,3,4-Tetra(p-methoxyphenyl)naphthalene; or
3,8,11,16-Tetramethoxy-perylo[3,2,1,12-pqrab]perylene, Another illustrative class of materials useful as the hole-trapping materials includes structures having a furan moiety.

Another illustrative class of materials useful as the hole-trapping materials includes structures having an alkyl or aryl moiety containing a silicon atom or atoms including the following:

Another illustrative class of materials useful as the hole-trapping materials includes structures having an alkyl or aryl moiety containing a phosphorous atom or atoms.

Another illustrative class of materials useful as the hole-trapping materials includes structures having a thiophene moiety.

Materials for the host of the light-emitting layer of the present invention include organic compounds that are capable of carrying both electrical charges and forming a continuous and substantially pin-hole-free thin film. They can be polar, such as (i) the common host for green, yellow, orange, and red OLEDs BAlQ and other similar oxinoid and oxinoid-like materials and metal complexes, and (ii) common hosts of heterocyclic family for blue, blue-green, green, yellow, orange, and red OLEDs such as those based on oxadiazole, imidazole, pyridine, phenanthroline, triazine, triazole, quinoline and other moieties. They also can be nonpolar, such as (i) the common hosts of anthracene family for blue, blue-green, green, yellow, orange, and red OLEDs, such as 2-(1,1-dimethylethyl)-9,10-bis(2-naphthalenyl)anthracene (TBADN), 9,10-Bis[4-(2,2-diphenylethenyl)phenyl]anthracene, and 10,10'-Diphenyl-9,9'-bianthracene, (ii) common hosts of rubrene family for yellow, orange, and red OLEDs, such as rubrene and 5,6,11,12-tetrakis(2-naphthyl)tetracene, and (iii) common hosts of triarylamine family for blue, blue-green, green, yellow, orange, and red OLEDs such as NPB, TNB, and TPD.

The necessary condition is that the hole-trapping material be able to trap holes in whatever host component is chosen. This property is characterized by the oxidation potentials (Eox) of the hole-trapping material and the host. Another necessary condition is that the bandgap of the luminescent dopant be smaller than the bandgap of the hole-trapping material and the host. This ensures that electronic excitation energy transfer from the hole-trapping material and the host, resulting from the recombination of electrons and holes in the hole-trapping material and host, to the light-producing dopants is favorable.

The first preferred class of materials useful as the host includes structures having an anthracene moiety. Exemplary of contemplated anthracene compounds are those satisfying the following structural formula:

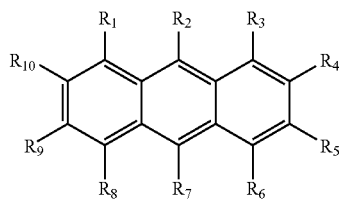

wherein:

substituents $R_2$ and $R_7$ are each individually and independently alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; and substituents $R_1$ through $R_{10}$ excluding $R_2$ and $R_7$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{10}$ substituents excluding $R_2$ and $R_7$ form an annelated benzo-, naphtho-, anthra-, phenanthro-, fluorantheno-, pyreno-, triphenyleno-, or peryleno-substituent or its alkyl or aryl substituted derivative;or any two adjacent $R_1$ through $R_{10}$ substituents excluding $R_2$ and $R_7$ form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

Illustrative of useful anthracene compounds and their abbreviated names are the following:
2-(1,1-dimethylethyl)-9,10-bis(2-naphthalenyl)anthracene (TBADN);
9,10-bis(2-naphthalenyl)anthracene (ADN);
9,10-bis(6-cyano-2-naphthalenyl)anthracene (ADN(CN)$_2$);
9-biphenyl-10-(2-naphthalenyl)anthracene (BPNA);
9,10-bis(1-naphthalenyl)anthracene;
9,10-Bis[4-(2,2-diphenylethenyl)phenyl]anthracene;
9,10-Bis([1,1':3',1''-terphenyl]-5'-yl)anthracene;
9,9'-Bianthracene;
10,10'-Diphenyl-9,9'-bianthracene (Ph$_2$A$_2$);
10,10'-Bis([1,1':3',1''-terphenyl]-5'-yl)-9,9'-bianthracene;
2,2'-Bianthracene;
9,9',10,10'-Tetraphenyl-2,2'-bianthracene (2,2'DPA$_2$);
9,10-Bis(2-phenylethenyl)anthracene;
9-Phenyl-10-(phenylethynyl)anthracene;
9,9',9''-(1,3,5-Benzenetriyl)tris[10-(9-phenanthrenyl)-anthracene;
1,1'-[5-[10-(4-Methoxyphenyl)-9-anthracenyl]-1,3-phenylene]bis-pyrene;
1,1'-(9,10-Anthracenediyldi-4,1-phenylene)bis-pyrene;
9,10-Bis[3-(9-phenanthrenyl)phenyl]-anthracene;
9-[5-(9-Phenanthrenyl)[1,1'-biphenyl]-3-yl]-10-phenyl-anthracene;
2-(1,1-Dimethylethyl)-9,10-di-9-phenanthrenyl-anthracene;
7-(p-9-Anthrylphenyl)-benz[a]anthracene;
3-[4-[10-(3-Fluoranthenyl)-9-anthracenyl]phenyl]-fluoranthene;
3-[10-[4-(2-Naphthalenyl)phenyl]-9-anthracenyl]-fluoranthene;
3-[4-[10-(2Naphthalenyl)-9-anthracenyl]phenyl]-fluoranthene;
3,3'-(9,10-Anthracenediyl)bis[8,11-diphenyl-benzo[k]fluoranthene; or
3,3'-(9,10-Anthracenediyl)bis[7,12-di-1-naphthalenyl-benzo[k]fluoranthene.

Another preferred class of materials as the host is the oxinoid compounds. The list of oxinoid compounds includes metal complexes with two bi-dentate ligands and one monodentate ligand, for example Al(2-MeQ)$_2$(X) where X is any aryloxy, or alkoxy group. For example, a bis(8-quinolinolato)(phenolate)aluminum(III) chelate of Formula B below:

(R'-Q)$_2$Al—O-L  Formula B wherein:
Q in each occurrence represents a substituted 8-quinolinolato ligand;
R' represents an 8-quinolinolato ring substituent chosen to block sterically the attachment of more than two substituted 8-quinolinolato ligands to the aluminum atoms;
O-L is a arylolato ligand; and
L is a hydrocarbon group that includes an aryl moiety.

From the foregoing it is apparent that the metal can be monovalent, divalent, or trivalent metal. The metal can, for example, be an alkali metal, such as lithium, sodium, rubidium, cesium, or potassium; an alkaline earth metal, such as magnesium, strontium, barium, or calcium; or an earth metal, such as boron or aluminum, gallium, and indium. Generally any monovalent, divalent, or trivalent metal known to be a useful chelating metal can be employed.

A heterocyclic nucleus can contain two fused aromatic rings, one of which is an azole or azine ring. Additional rings, including both aliphatic and aromatic rings, can be fused with the two rings, if required. To avoid adding molecular bulk without improving on function, the number of ring atoms is preferably maintained at 18 or less.

Illustrative of useful chelated oxinoid compounds and their abbreviated names are the following:

Bis(8-quinolinol)magnesium (MgQ$_2$);
8-Quinolinol lithium (LiQ);
Bis(2-methyl-8-quinolinolato)(4-phenylphenolato)aluminum(III) (BAlq);
Bis(2-methyl-8-quinolinolato)phenolato)aluminum(III);
Bis(2-methyl-8-quinolinolato)ortho-cresolato)aluminum (III);
Bis(2-methyl-8-quinolinolato)(meta-cresolato)aluminum (III);
Bis(2-methyl-8-quinolinolato)(para-cresolato)aluminum (III);
Bis(2-methyl-8-quinolinolato)(ortho-phenylphenylato)aluminum(III);
Bis(2-methyl-8-quinolinolato)(meta-phenylphenylato)aluminum(III);
Bis(2-methyl-8-quinolinolato)(2,3-dimethyl-phenylato)aluminum(III);
Bis(2-methyl-8-quinolinolato)(2,6-dimethyl-phenylato)aluminum(III);
Bis(2-methyl-8-quinolinolato)(3,4-dimethyl-phenolato)aluminum(III);
Bis(2-methyl-8-quinolinolato)(3,5-dimethyl-phenolato)aluminum(III);
Bis(2-methyl-8-quinolinolato)(2,3-di-tert-butyl-phenolato) aluminum(III);
Bis(2-methyl-8-quinolinolato)(2,6-diphenyl-phenolato)-aluminum(III);
Bis(2-methyl-8-quinolinolato)(2,4,6-triphenyl-phenolato) aluminum(III);
Bis(2-methyl-8-quinolinolato)(2,3,6-trimethyl-phenolato) aluminum(III);
Bis(2-methyl-8-quinolinolato)(2,3,5,6-tetramethyl-phenolato)-aluminum(III);
Bis(2-methyl-8-quinolinolato)(1-naphtholato)aluminum (III);
Bis(2-methyl-8-quinolinolato)(2-naphtholato)aluminum (III);
Bis(2,4-dimethyl-8-quinolinolato)(2-phenylphenolato)aluminum(III);
Bis(2,4-dimethyl-8-quinolinolato)(4-phenylphenolato)aluminum(III);
Bis(2,4-dimethyl-8-quinolinolato)(3-phenylphenolato)aluminum(III);
Bis(2,4-dimethyl-8-quinolinolato)(3,5-dimethyl-phenolato) aluminum(III);
Bis(2,4-dimethyl-8-quinolinolato)(3,5-di-tert-butyl-phenolato)-aluminum(III);
Bis(8-quinolinol)zinc (ZnQ$_2$);
Bis(10-hydroxybenzo[h]quinolinato)beryllium(BeBq$_2$); or
Bis(2-Methyl-8-quinolinol)magnesium (Mg(2-MeQ)$_2$).

Another class of materials useful as the host includes structures having a fluorene moiety. Exemplary of contemplated fluorene compounds are those satisfying the following structural formula:

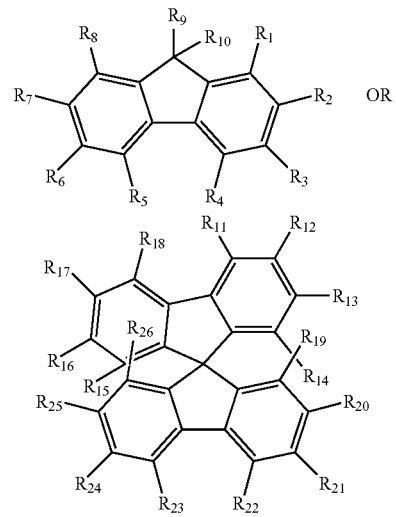

OR wherein:
substituents $R_1$ through $R_{25}$ are each individually hydrogen, fluoro, cyano, alkoxy, aryloxy, diarylamino, arylalkylamino, dialkylamino, trialkylsilyl, triarylsilyl, diaryalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{25}$ substituents excluding $R_9$ and $R_{10}$ form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{25}$ substituents excluding $R_9$ and $R_{10}$ form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

Illustrative of useful fluorene compounds and their abbreviated names are the following:

2,2',7,7'-Tetraphenyl-9,9'-spirobi[9H-fluorene];
2,2',7,7'-Tetra-2-phenanthrenyl-9,9'-spirobi[9H-fluorene];
2,2'-Bis(4-N,N-diphenylaminophenyl)-9,9'-spirobi[9H-fluorene] (CAS 503307-40-2);
4'-Phenyl-spiro[fluorene-9,6'-[6H]indeno[1,2-j]fluoranthene];
2,3,4-Triphenyl-9,9'-spirobifluorene;
11,11'-Spirobi[11H-benzo[b]fluorene];
9,9'-Spirobi[9H-fluorene]-2,2'-diamine;
9,9'-Spirobi[9H-fluorene]-2,2'-dicarbonitrile;
2',7'-Bis([1,1'-biphenyl]-4-yl)-N,N,N',N'-tetraphenyl-9,9'-spirobi[9H-fluorene]-2,7-diamine;
9,9,9',9",9"-Hexaphenyl-2,2':7',2"-ter-9H-fluorene;
2,7-Bis([1,1'-biphenyl]-4-yl)-9,9'-spirobi[9H-fluorene];
2,2',7,7'-tetra-2-Naphthalenyl-9,9'-spirobi[9H-fluorene]; or
9,9'-[(2,7-Diphenyl-9H-fluoren-9-ylidene)di-4,1-phenylene]bis-anthracene.

Another class of materials useful as the host includes structures having a naphthacene moiety. Exemplary of contemplated naphthacene compounds are those satisfying the following structural formula:

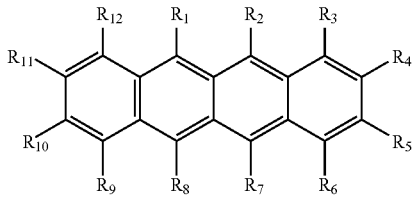

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

Illustrative of useful naphthacene compounds and their abbreviated names are the following:

5,6,11,12-Tetraphenylnaphthacene (rubrene);
5,12-Bis(2-naphthyl)-6,11-diphenyltetracene;
5,12-Bis(2-mesityl)-6,11-diphenyltetracene;
5,12-Bis(1-naphthyl)-6,11-diphenyltetracene;
5,6,11,12-Tetrakis(2-naphthyl)tetracene;
10,10'-[(6,11-Diphenyl-5,12-naphthacenediyl)di-4,1-phenylene]bis-[2,3,6,7-tetrahydro-1H,5H-benzothiazolo[5,6,7-ij]quinolizine;
9,10,15,16-Tetraphenyl-dibenzo[a,c]naphthacene;
5,6,13,14-Tetraphenylpentacene;
4,4'-(8,9-Dimethyl-5,6,7,10,11,12-hexaphenyl-1,4-naphthacenediyl)bis-benzonitrile;
4,4'-(8,9-Dimethoxy-5,6,7,10,11,12-hexaphenyl-1,4-naphthacenediyl)bis-[N,N-diphenylbenzenamine];
1,2,3,5,6,11,12-Heptaphenylnaphthacene;
1,4,5,6,7,10,11,12-Octaphenylnaphthacene;
6,11-diphenyl-5,12-bis(4'-N,N-diphenylaminophenyl)naphthacene;
7,8,15,16-Tetraphenyl-benzo[a]pentacene;
2,3,5,6,11,12-Hexaphenylnaphthacene;
6,11-diphenyl-5,12-bis(4'-cyanophenyl)naphthacene;
6,11-diphenyl-5,12-bis(4'-(2-thienyl)phenyl)naphthacene; or
9,10,19,20-Tetraphenyl-tetrabenzo[a,c,j,l]naphthacene.

Another class of materials useful as the host includes benzenoids that contain other heterocyclic structures. These structures include benzoxazolyl, and thio and amino analogs of benzoxazolyl of following general molecular structure:

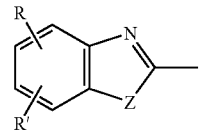

wherein:

Z is O, NR" or S; R and R', are individually hydrogen, alkyl of from 1 to 24 carbon atoms, aryl or hetero-atom substituted aryl of from 5 to 20 carbon atoms, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or atoms necessary to complete a fused aromatic ring; and R" is hydrogen; alkyl of from 1 to 24 carbon atoms; or aryl of from 5 to 20 carbon atoms. These structures further include alkyl, alkenyl, alkynyl, aryl, substituted aryl, benzo-, naphtho-, anthra-, phenanthro-, fluorantheno-, pyreno-, triphenyleno-, or peryleno-, 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, indeno, fluoro, cyano, alkoxy, aryloxy, amino, aza, heterocyclic, keto, or dicyanomethyl derivatives thereof.

The material selection criteria for the dopant in the light-emitting layer are (1) the dopant has a high efficiency of fluorescence or phosphorescence in the light-emitting layer, and (2) it has a bandgap, that is difference in energy between the ground electronic state and excited electronic state, (singlet bandgap for the case of fluorescent dopants and triplet bandgap for the case of phosphorescent dopants) smaller than those of the host and the hole-trapping material.

For red-emitting OLEDs, a preferred class of dopants of this invention is the DCM class and has the general formula:

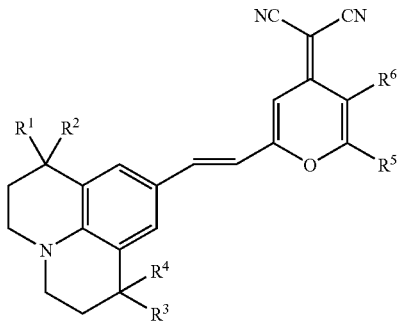

wherein:

$R^1$, $R^2$, $R^3$, and $R^4$ are individually alkyl of from 1 to 10 carbon atoms;

$R^5$ is alkyl of from 2 to 20 carbon atoms, aryl, sterically hindered aryl, or heteroaryl; and $R^6$ is alkyl of from 1 to 10 carbon atoms, or a 5- or 6-membered carbocyclic, aromatic, or heterocyclic ring connecting with $R^5$.

These materials possess fluorescence efficiencies as high as unity in solutions and emit in the orange and red spectral region. Representative materials of this class and their abbreviated names include:

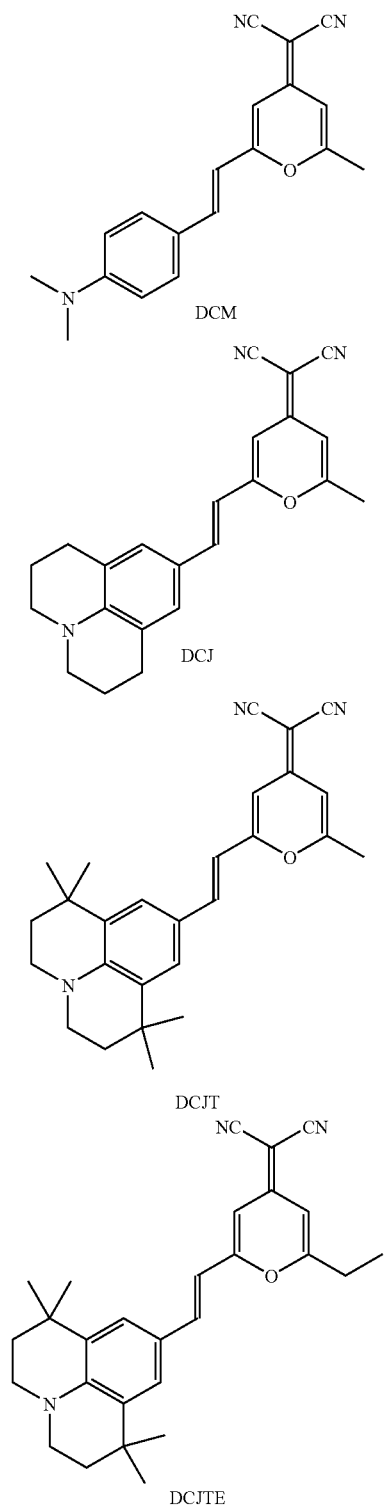

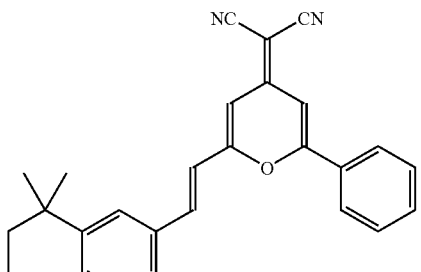

DCJTP

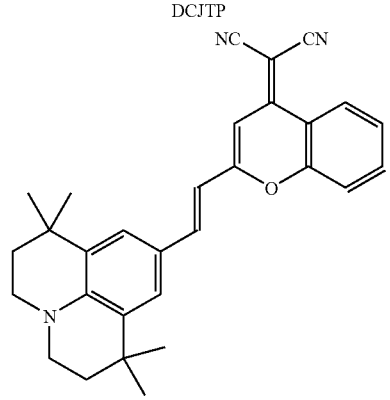

DCJTBz

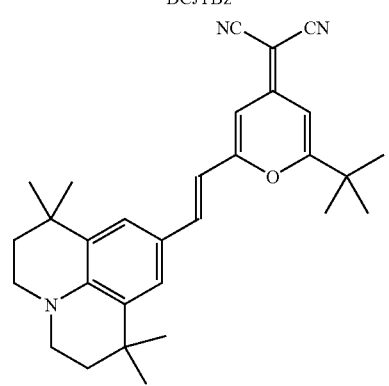

DCJTB

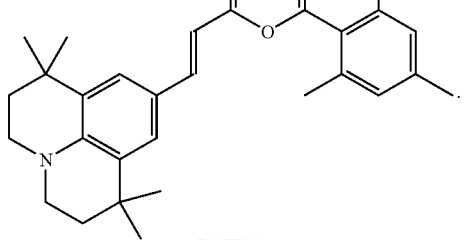

DCJTMes

For red-emitting OLEDs, another preferred class of dopants of this invention comprises compounds having a periflanthene moiety:

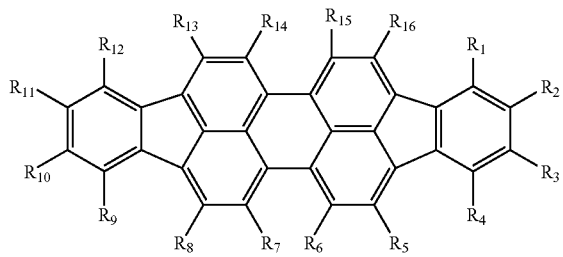

wherein:

substituents $R_1$ through $R_{16}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{16}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{16}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

These materials possess fluorescence efficiencies as high as unity in solutions and emit in the orange and red spectral region. One representative material of this class is:

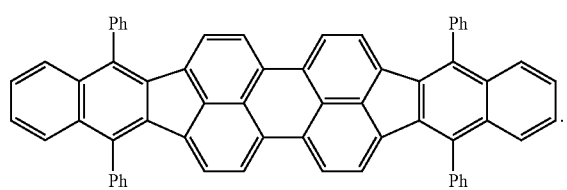

Red 2

For green-emitting OLEDs, a class of fluorescent materials is useful as the dopants in the present invention, which includes compounds having a coumarin moiety:

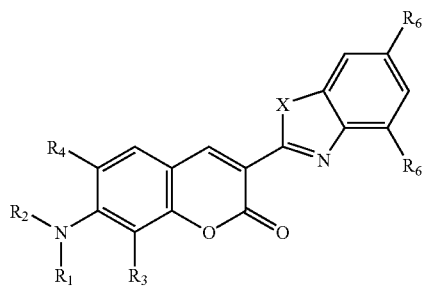

wherein:

$X=S$, O, or $NR_7$;

$R_1$ and $R_2$ are individually alkyl of from 1 to 20 carbon atoms, aryl or carbocyclic systems;

$R_3$ and $R_4$ are individually alkyl of from 1 to 10 carbon atoms, or a branched or unbranched 5 or 6 member substituent ring connecting with $R_1$ and $R_2$, respectively;

$R_5$ and $R_6$ are individually alkyl of from 1 to 20 carbon atoms, which are branched or unbranched; and $R_7$ is any alkyl or aryl group.

These materials possess fluorescence efficiencies as high as unity in solutions. Representative materials of this class and their abbreviated names include:

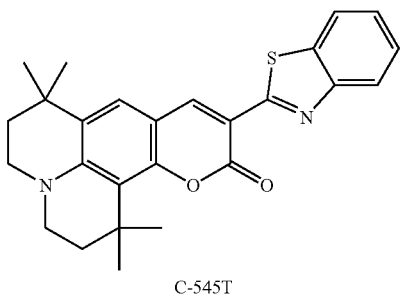

C-545T

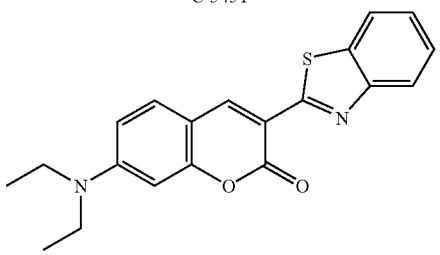

C-6

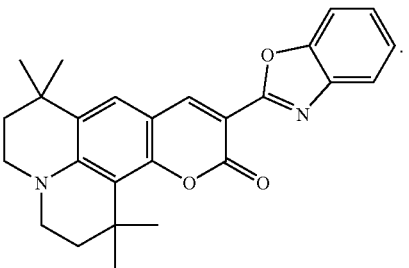

C-525T

For green-emitting OLEDs, another class of fluorescent materials is useful as the dopants in the present invention, which includes compounds having a quinacridone moiety:

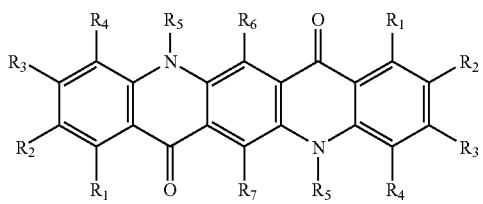

wherein:

substituents $R_1$ through $R_7$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_4$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_4$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

These materials possess fluorescence efficiencies as high as unity in solutions. Representative materials of this class and their abbreviated names include:

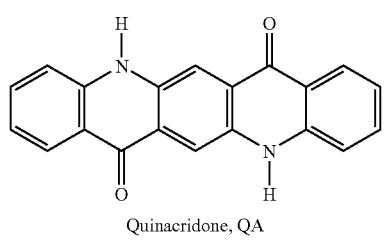

Quinacridone, QA

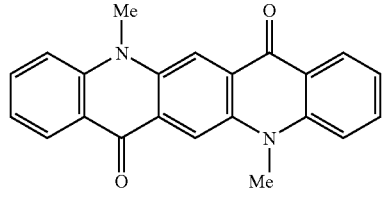

Dimethylquinacridone, DMQA

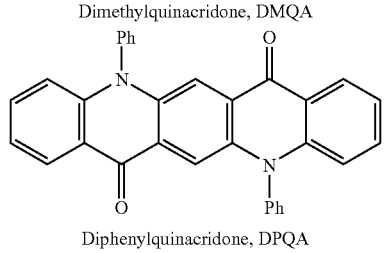

Diphenylquinacridone, DPQA

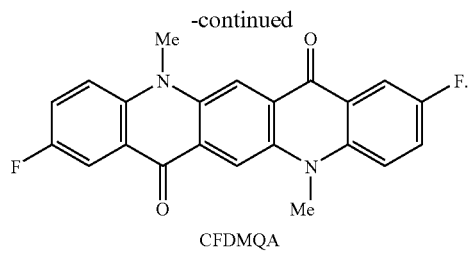

CFDMQA

For green, green-yellow, and yellow emitting OLEDs, another class of fluorescent materials is useful as the dopants in the present invention, which includes compounds having a DPMB (dipyridinomethene borate) moiety:

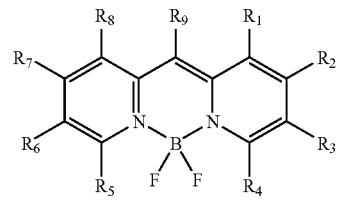

wherein:

substituents $R_1$ through $R_9$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_9$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_9$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

These materials possess fluorescence efficiencies as high as unity in solutions. Representative materials of this class include:

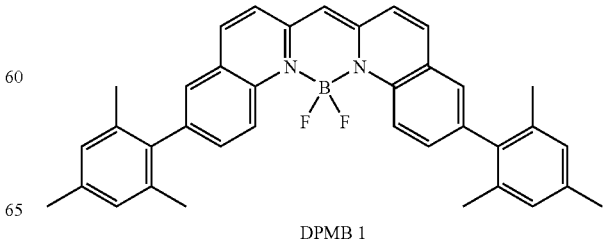

DPMB 1

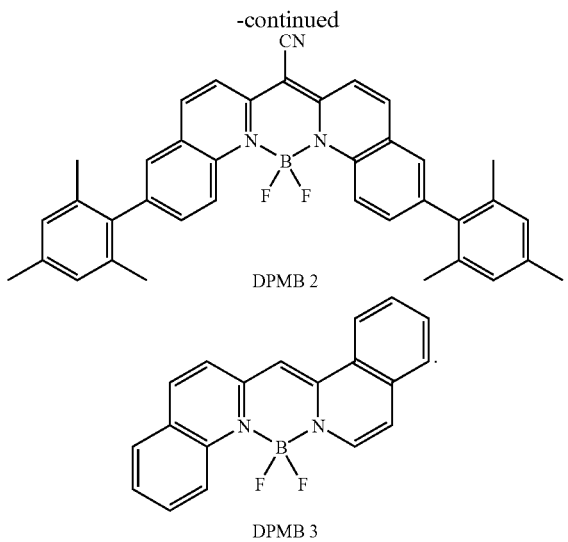

DPMB 2

DPMB 3

For yellow- and orange-emitting OLEDs, a preferred class of dopants for this invention includes compounds having an indenoperylene moiety:

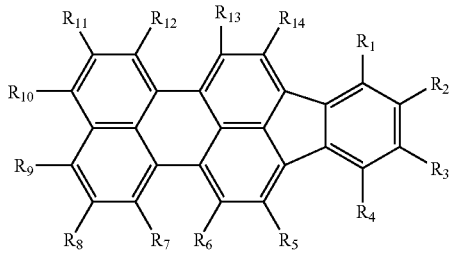

wherein:

substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

These materials possess fluorescence efficiencies as high as unity in solutions. One representative material of this class is:

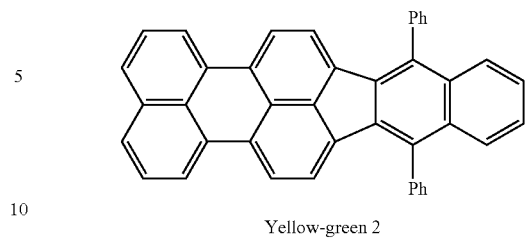

Yellow-green 2

For yellow- and orange-emitting OLEDs, another preferred class of dopants for this invention includes compounds having a naphthacene moiety:

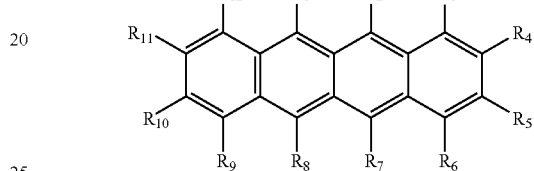

wherein:

substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

These materials possess fluorescence efficiencies as high as unity in solutions and emit in the spectral region from greenish-yellow to red. Representative materials of this class and their abbreviated names include:

5,6,11,12-Tetraphenylnaphthacene (rubrene);
2,2'-[(6,11-Diphenyl-5,12-naphthacenediyl)di-4,1-phenylene]bis(6-methylbenzothiazole) (Orange 2);
5,12-Bis(2-mesityl)-6,11-diphenyltetracene;
5,6,11,12-Tetrakis(2-naphthyl)tetracene;
10,10'-[(6,11-Diphenyl-5,12-naphthacenediyl)di-4,1-phenylene]bis-[2,3,6,7-tetrahydro-1H,5H-benzothiazolo[5,6,7-ij]quinolizine;
5,6,13,14-Tetraphenylpentacene;
4,4'-(8,9-Dimethoxy-5,6,7,10,11,12-hexaphenyl-1,4-naphthacenediyl)bis-[N,N-diphenylbenzenamine];
6,11-Diphenyl-5,12-bis(4'-N,N-diphenylaminophenyl) naphthacene;

7,8,15,16-Tetraphenyl-benzo[a]pentacene; or
6,11-Diphenyl-5,12-bis(4'-cyanophenyl)naphthacene.

For green-blue, blue-green, and blue-emitting OLEDs, a preferred class of dopants for this invention includes compounds having a BASB (bisaminostyrylbenzene) moiety:

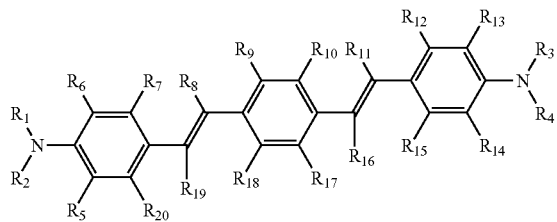

wherein:
each double bond can be either E or Z independently of the other double bond; substituents $R_1$ through $R_4$ are each individually and independently alkyl of from 1 to 24 carbon atoms, aryl, or substituted aryl of from 5 to 30 carbon atoms, heterocycle containing at least one nitrogen atom, or at least one oxygen atom, or at least one sulfur atom, or at least one boron atom, or at least one phosphorus atom, or at least one silicon atom, or any combination thereof; and substituents $R_5$ through $R_{20}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_5$ through $R_{20}$ substituents form an annelated benzo-, naphtho-, anthra-, phenanthro-, fluorantheno-, pyreno-, triphenyleno-, or peryleno-substituent or its alkyl or aryl substituted derivative; or any two $R_5$ through $R_{20}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

These materials possess fluorescence efficiencies as high as unity in solutions. Representative materials of this class include:
4-(Diphenylamino)-4'-[4-(diphenylamino)styryl]stilbene;
4-(Di-p-Tolylamino)-4'-[(di-p-tolylamino)styryl]stilbene (Blue-Green 2);
4,4'-[(2,5-Dimethoxy-1,4-phenylene)di-2,1-ethenediyl]bis[N,N-bis(4-methylphenyl)benzenamine;
4,4'-(1,4-Naphthalenediyldi-2,1-ethenediyl)bis[N,N-bis(4-methylphenyl)-benzenamine;
3,3'-(1,4-Phenylenedi-2,1-ethenediyl)bis[9-(4-ethylphenyl)-9H-carbazole;
4,4'-(1,4-Phenylenedi-2,1-ethenediyl)bis[N,N-diphenyl-1-naph-thalenamine;
4,4'-[1,4-Phenylenebis(2-phenyl-2,1-ethenediyl)]bis[N,N-diphenyl-benzenamine];
4,4',4''-(1,2,4-Benzenetriyltri-2,1-ethenediyl)tris[N,N-diphenyl-benzenamine];
9,10-Bis[4-(di-p-tolylamino)styryl]anthracene; or
α,α'-(1,4-Phenylenedimethylidyne)bis[4-(diphenylamino)-1-naph-thaleneacetonitrile.

For blue-emitting OLEDs, another preferred class of dopants for this invention includes compounds having a perylene moiety:

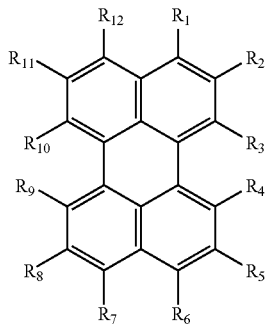

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

These materials possess fluorescence efficiencies as high as unity in solutions. Representative materials of this class include:
Perylene;
2,5,8,11-Tetra-tert-butylperylene (TBP);
2,8-Di-tert-Butylperylene;
Ovalene;
Dibenzo[b,ghi]perylene; or
Dibenzo[b,k]perylene.

For blue-emitting OLEDs, another preferred class of dopants for this invention includes compounds having a ADPMB (aza-DPMB) moiety:

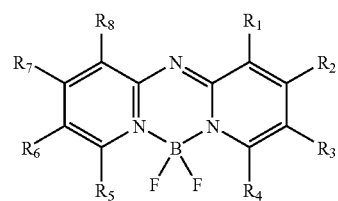

wherein:

substituents $R_1$ through $R_8$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $R_1$ through $R_8$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_8$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

These materials possess fluorescence efficiencies as high as unity in solutions. Representative materials of this class include:

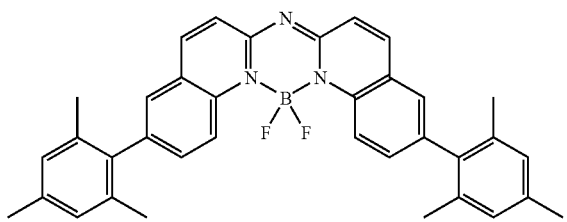

Blue 2

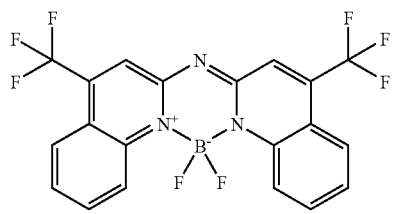

ADPMB 1

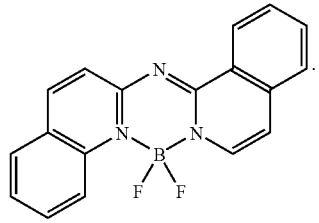

ADPMB 2

For blue- or blue-green emitting OLEDs, another preferred class of dopants for this invention includes compounds where the boron complex is represented by having a DHMB moiety:

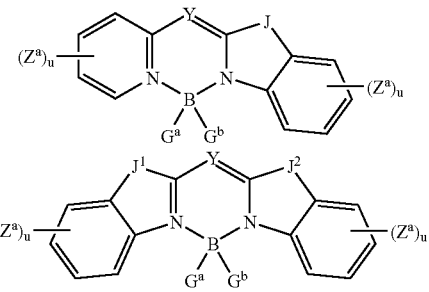

wherein:

substituents $Z^a$ are each individually fluoro, cyano, alkoxy, aryloxy, diarylamino, arylalkylamino, dialkylamino, trialkylsilyl, triarylsilyl, diarylalkylsilyl, dialkylarylsilyl, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; or any two adjacent $Z^a$ substituents form an annelated benzo-, naphtho-, anthra-, phenanthro-, fluorantheno-, pyreno-, triphenyleno-, or peryleno-substituent or its alkyl or aryl substituted derivative; each u independently is 0-4; Y represents N or C—X, wherein X represents hydrogen, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; $G^a$ and $G^b$ represent independently halogen, alkyl, aryl, alkoxy, arylthio, sulfamoyl, acetamido, diarylamino, aryloxy, fluoro, or alkyl carboxylate; J, $J^1$ and $J^2$ independently represents O, S, Se, or N-A, wherein A represents alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof.

These materials possess fluorescence efficiencies as high as unity in solutions. Representative materials of this class include:

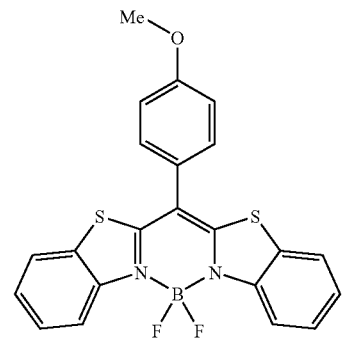

DHMB 1

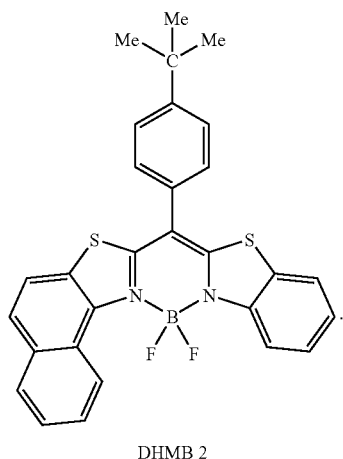

DHMB 2

The composition of the light-emitting layer of this invention is such that the hole-trapping material can be present at 0.01 to less than 50% by volume relative to the light-emitting layer volume. The preferred range for the hole-trapping material is from 0.1 to 15% by volume relative to the light-emitting layer volume. The most preferred range is from 0.5 to less than 5% by volume relative to the light-emitting layer volume. The hole-trapping ability is often maximized around 1 to 4% vol. The concentration range for the dopant is from 0.1% to 10% by volume. The preferred concentration range for the dopant is from 1% to 5% by volume. The thickness of the light-emitting layer useful in this invention is between 50 Angstroms and 5000 Angstroms. A thickness in this range is sufficiently large to enable recombination of charge carriers and, therefore, electroluminescence to take place exclusively in this layer. A preferred range is between 100 Angstroms and 1000 Angstroms, where the overall OLED device performance parameters, including drive voltage, are optimal.

A useful method for forming the light-emitting layer of the present invention is by vapor deposition in a vacuum chamber. This method is particularly useful for fabricating OLED devices, where the layer structure, including the organic layers, can be sequentially deposited on a substrate without significant interference among the layers. The thickness of each individual layer and its composition can be precisely controlled in the deposition process. To produce the desired composition of the light-emitting layer, the rate of deposition for each component is independently controlled using a deposition rate monitor.

Another useful method for forming the light-emitting layer of the present invention is by spin-coating or by ink-jet printing. This method is particularly useful for fabricating lower-cost OLED devices. Composition of the light-emitting layer is determined by the concentration of each component in the solutions being coated.

Returning to FIG. 2, hole-transport layer 231 and electron-transport layer 233 provide the functions of transporting holes and electrons, respectively, to the light-emitting layer 232. The use of these layers and their material compositions in OLED devices have been disclosed by Tang et al. in commonly assigned U.S. Pat. No. 4,769,292, included herein by reference. A typical hole-transport layer includes the hole-transporting compounds such as N,N'-bis(1-naphthyl)-N,N'-diphenylbenzidine (NPB), N,N'-bis(1-naphthyl)-N,N'-bis(2-naphthyl)benzidine (TNB), and N,N'-bis(3-tolyl)-N,N'-diphenylbenzidine (TPD).

Returning to FIG. 3, hole-injection layer 331 and electron-injection layer 335 provide the functions of improving the hole-injection from the anode and electron-injection from the cathode 340, respectively. The use of a hole-injection layer in OLED devices has been disclosed by Van Slyke et al. in commonly assigned U.S. Pat. No. 4,720,432, included herein by reference. The use of an electron-injection layer has been disclosed by Hung et al. in commonly assigned U.S. Pat. No. 5,776,622, also included herein by reference.

In accordance with the teachings of this invention, it is further contemplated that the hole-trapping material used in the specified concentration range can be part of an organic light-emitting device containing a host and a dopant as described above wherein the organic light-emitting device would emit other than blue or blue-green light, such as green, yellow, orange, red, or white light.

COMPARATIVE AND INVENTIVE EXAMPLES
1-5

Efficiency-improving Effect of the Hole-trapping
Material on Electroluminescence of Blue OLEDS OLED devices were prepared as follows. A glass substrate coated with about 850 Å transparent indium-tin-oxide (ITO) conductive layer was cleaned and dried using a commercial glass scrubber tool. The ITO surface was subsequently treated with an oxidative plasma to condition the surface as an anode. Over the ITO was deposited a 10 Å thick hole-injecting layer of fluorocarbon (CFx) by plasma-assisted deposition of $CHF_3$. The following layers were deposited in the following sequence by sublimation from heated crucible boats in a conventional vacuum deposition chamber under a vacuum of approximately $10^{-6}$ Torr: (1) a hole-transport layer, 750 Å thick, including NPB; (2) a light-emitting layer, 400 Å thick, including host and dopant and the hole-trapping material in certain ratio (indicated in Tables 1-3); (3) an 200 Å electron-transport layer, including $AlQ_3$; and (4) a 2200 Å cathode, including an alloy of magnesium and silver with a Mg:Ag volume ratio of 10:1. Following that the devices were encapsulated in nitrogen atmosphere along with calcium sulfate as a desiccant.

The EL characteristics of these devices were evaluated using a constant current source and a photometer. The drive voltage, EL efficiency in cd/A and W/A, CIE coordinates, peak wavelength, $\lambda_{max}$, full spectral width at half-maximum, FWHM, and loss or gain in EL efficiency as current density, J, increases from 0.5 to 100 $mA/cm^2$ W/A vs. J (0.5-100) change, at current densities ranging from relatively low, 0.5 $mA/cm^2$, to relatively high, 100 $mA/cm^2$, were measured. The EL efficiency in W/A, CIE coordinates, $\lambda_{max}$, FWHM, and operational lifetimes at average AC current density of 40 $mA/cm^2$ (0.5 ms forward bias at 80 $mA/cm^2$ alternating with the 0.5 ms of reverse bias of −14V) and at room temperature (RT) and at average AC current density of 20 $mA/cm^2$ and 70° C. are given in Table 1.

As can be seen from Table 1, addition of less than 5% of a hole-trapping material results in dramatically improved electroluminescent efficiency in devices containing a variety of hosts and dopants. Thus, co-doping NPB into a blue light-emitting layer of TBADN+Blue 2 or TBADN+TBP improves current efficiency (in W/A) by 1.3-2 times (from 0.045-0.055 to 0.062-0.085 W/A). With the ADN or BPNA as hosts, significant improvement is also shown in luminance efficiency.

TABLE 1

Table 1: Comparative Examples 1-5:

| Cell configuration | Voltage, V | Efficiency, cd/A | Efficiency, W/A at 20 mA/cm² (at 0.5 mA/cm²) | $CIE_x$ $CIE_y$ | $\lambda_{max}$ FWHM, nm | W/A vs J (0.5-100) change, % | @40 mA/cm², RT, AC $T_{90\%}$, h | @40 mA/cm², RT, AC $T_{50\%}$, h | @20 mA/cm², 70° C., AC $T_{90\%}$, h | @20 mA/cm², 70° C., AC $T_{50\%}$, h |
|---|---|---|---|---|---|---|---|---|---|---|
| Comparative Example 1: Host TBADN: | | | | | | | | | | |
| 750 ÅNPB \| 400 ÅTBADN + 0.8% Blue 2 \| 200 ÅAlq | 8.2 | 2.1 | 0.051 | 0.141 0.129 | 452 16 | first +5 then −16 | 100 | 750 | 30 | 400 |
| Comparative Example 2: Host TBADN: | | | | | | | | | | |
| 750 ÅNPB \| 400 ÅTBADN + 1% TBP \| 200 ÅAlq | 7.9 | 2.6 | 0.047 (0.061) | 0.138 0.190 | 464 52 | −37 | 100 | 800 | 40 | 650 |
| Comparative Example 3: Host ADN: | | | | | | | | | | |
| 750 ÅNPB \| 400 ÅADN + 0.8% Blue 2 \| 200 ÅAlq | 8.6 | 2.5 | 0.055 (0.034) | 0.144 0.141 | 452 16 | +60 | 210 | 1,800 | 150 | 1,200 |
| Comparative Example 4: Host ADN: | | | | | | | | | | |
| 750 ÅNPB \| 400 ÅADN + 1% TBP \| 200 ÅAlq | 8.7 | 3.1 | 0.054 (0.042) | 0.141 0.200 | 464 52 | +10 | 250 | 1,500 | 150 | 1,500 |
| Comparative Example 5: Host BPNA: | | | | | | | | | | |
| 750 ÅNPB \| 400 ÅBPNA + 0.8% Blue 2 \| 200 ÅAlq | 7.2 | 2.5 | 0.057 (0.043) | 0.150 0.140 | 452 16 | +28 | 160 | 1,800 | 65 | 1,100 |

Blue OLED data at 20 mA/cm² (unless otherwise noted): electroluminescence efficiency gain upon addition of less than 5% hole-trapping material
($\lambda_{max}$ is peak wavelength, nm;
FWHM is full spectral width at half-maximum, nm;
W/A vs. J (0.5-100) is change in W/A efficiency as the current density increases from 0.5 to 100 mA/cm²;
RT is room temperature, 22° C.;
$T_{50\%}$ is operational lifetime when an OLED looses half of its initial brightness at constant current drive;
$T_{90\%}$ is the time of operation by which an OLED looses 10% of its initial brightness at constant current drive)

TABLE 1

Inventive Examples 1-5: NPB as the hole-trapping material:

| Cell configuration | Voltage, V | Efficiency, cd/A | Efficiency, W/A at 20 mA/cm² (at 0.5 mA/cm²) | $CIE_x$ $CIE_y$ | $\lambda_{max}$ FWHM, nm | W/A vs J (0.5-100) change, % | @40 mA/cm², RT, AC $T_{90\%}$, h | @40 mA/cm², RT, AC $T_{50\%}$, h | @20 mA/cm², 70° C., AC $T_{90\%}$, h | @20 mA/cm², 70° C., AC $T_{50\%}$, h |
|---|---|---|---|---|---|---|---|---|---|---|
| Inventive Example 1: Host TBADN: | | | | | | | | | | |
| 750 ÅNPB \| 400 ÅTBADN + 2-5% NPB + 0.8% Blue 2 \| 200 ÅAlq | 8.5 | 3.0 | 0.078 (0.080) | 0.142 0.125 | 452 16 | −7 | 120 | 800 | 50 | 500 |
| Inventive Example 2: Host TBADN: | | | | | | | | | | |
| 750 ÅNPB \| 400 ÅTBADN + 3-6% NPB + 1.5% TBP \| 200 ÅAlq | 8.2 | 3.4 | 0.062 (0.092 = 5.1 cd/A) | 0.136 0.189 | 464 52 | −47 | 250 | 1,500 | 180 | 900 |
| Inventive Example 3: Host ADN: | | | | | | | | | | |
| 750 ÅNPB \| 400 ÅADN + 2% NPB + 0.8% Blue 2 \| 200 ÅAlq | 8.8 | 3.1 | 0.070 (0.056) | 0.144 0.144 | 452 16 | +15 | 100 | 1,200 | 200 | 1,700 |
| Inventive Example 4: Host ADN: | | | | | | | | | | |
| 750 ÅNPB \| 400 ÅADN + 2% NPB + 1% TBP \| 200 ÅAlq | 8.8 | 4.6 | 0.078 (0.071) | 0.137 0.209 | 464 52 | −10 | 180 | 1,200 | 150 | 1,500 |
| Inventive Example 5: HostBPNA: | | | | | | | | | | |
| 750 ÅNPB\|400 ÅBPNA + 2% NPB + 1% Blue 2 \| 200 ÅAlq | 7.9 | 3.2 | 0.070 (0.055) | 0.144 0.144 | 452 16 | +18 | 80 | 900 | 80 | 450 |

COMPARATIVE AND INVENTIVE EXAMPLES 6-8

Efficiency-improving Effect of the Hole-trapping Material on Electroluminescence of Blue OLEDs Containing Lithium Dopant in the Electron-transporting Layer For layer thicknesses and concentrations of materials in multi-component layers of each device see Table 2. OLED devices were prepared similar to Examples 1-5 except the electron-transporting layer AlQ$_3$ was doped with alkali metal, lithium, in the 1:1 molar ratio.

The EL characteristics of these devices are given in Table 2.

As can be seen from Table 2, Inventive Examples 6-8 demonstrate addition of the hole-trapping material at concentration of less than 5% results in the electroluminescence efficiency improvement of greater than 2 times than that of comparative devices for devices containing a variety of hosts with the dopant Blue 2 and lithium doping of the electron-transporting layer.

COMPARATIVE AND INVENTIVE EXAMPLES 9 AND 10

Efficiency-improving Effect of the Hole-trapping Material on Electroluminescence of Blue-Green OLEDs Containing Blue-Green 2 Dopant For layer thicknesses and concentrations of materials in multi-component layers of each device see Table 3. OLED devices were prepared similar to Examples 1-5 except that in place of the blue dopants the light-emitting layer contained 1-5% dopant Blue-Green 2.

The EL characteristics of these devices are given in Table 3.

As can be seen from Table 3, Inventive Examples 9 and 10 demonstrate addition of the hole-trapping material at concentration of less than 5% results in the device luminance efficiencies improvement to 0.10-0.11 W/A. Moreover, a thicker light-emitting layer comprising hole-trapping material, host, and dopant followed by an electron-transporting layer with added alkali metal dopant can provide 0.134 W/A (12.4 cd/A) at color coordinates of 0.16, 0.39 and a lifetime of 1,200 h at room temperature and −40 mA/cm$^2$.

TABLE 2

| | | | Comparative and inventive examples: | | | | | | | |
|---|---|---|---|---|---|---|---|---|---|---|
| | | | Efficiency, W/A at 20 mA/cm$^2$ (at | | $\lambda_{max}$ FWHM, | W/A vs J (0.5-100) | @40 mA/cm$^2$, RT, AC | | @20 mA/cm$^2$, 70° C., AC | |
| | Voltage, | Efficiency, | | CIE$_x$ | | | | | | |
| Cell configuration | V | cd/A | 0.5 mA/cm$^2$) | CIE$_y$ | nm | change, % | T$_{90\%}$, h | T$_{50\%}$, h | T$_{90\%}$, h | T$_{50\%}$, h |
| Comparative Examples 6-8: Hosts: TBADN (example 6), ADN (example 7), and BPNA (example 8) (all behave similarly) | | | | | | | | | | |
| 750 ÅNPB | 400 Åhost + 0.8% Blue 2 | 200 ÅAlq + 3.7% Li | 7.5 | 1.8 | 0.038 (0.044) | 0.134 0.144 | 452 16 | −20 | 200 | 2,000 | 100 | 1,500 |
| Inventive Example 6a: Host TBADN: | | | | | | | | | | |
| 750 ÅNPB | 400 ÅTBADN + 3.5% NPB + 0.8% Blue 2 | 200 ÅAlq + 3.7% Li | 8.0 | 3.7 | 0.077 (0.075) | 0.143 0.144 | 452 16 | −3 | 150 | 1,200 | 120 | 500 |
| Inventive Example 6b: Host TBADN: | | | | | | | | | | |
| 750 ÅNPB | 400 ÅTBADN + 3.5% NPB + 0.8% Blue 2 | 50 ÅAlq | 150 ÅAlq + 3.7% Li | 7.5 | 4.1 | 0.086 (0.089) | 0.141 0.155 | 452 16 | −13 | 60 | 900 | 40 | 400 |
| Inventive Example 7: Host ADN: | | | | | | | | | | |
| 750 ÅNPB | 400 ÅADN + 2% NPB + 0.8% Blue 2 | 200 ÅAlq + 3.7% Li | 7.7 | 3.7 | 0.085 (0.083) | 0.142 0.140 | 452 16 | ~0 | 120 | 1,400 | 80 | 450 |
| Inventive Example 8: Host BPNA: | | | | | | | | | | |
| 750 ÅNPB|400 ÅBPNA + 2.5% NPB + 0.8% Blue 2 | 200 ÅAlq + 3.7% Li | 7.0 | 3.5 | 0.082 (0.075) | 0.145 0.139 | 452 16 | +5 | 130 | 1,200 | 70 | 400 |

Blue OLED data at 20 mA/cm$^2$ (unless otherwise noted): electroluminescence efficiency gain upon addition of less than 5% hole-trapping material and lithium in electron-transport layer

TABLE 3

| Cell configuration | Voltage, V | Efficiency, cd/A | Efficiency, W/A at 20 mA/cm² (at 0.5 mA/cm²) | $CIE_x$ $CIE_y$ | $\lambda_{max}$ FWHM, nm | W/A vs J (0.5-100) change, % | @40 mA/cm², RT, AC | | @20 mA/cm², 70° C., AC | |
|---|---|---|---|---|---|---|---|---|---|---|
| | | | | | | | $T_{90\%}$, h | $T_{50\%}$, h | $T_{90\%}$, h | $T_{50\%}$, h |
| Comparative Example 9: HostTBADN: | | | | | | | | | | |
| 750 ÅNPB | 200 ÅTBADN + 2.5% Blue-Green 2 | 350 ÅAlq | 7.4 | 7.2 | 0.091 (0.105) | 0.155 0.310 | 472 56 | −25 | 130 | 950 | 110 | 850 |
| Inventive Example 9: NPB co-doping: HostTBADN: | | | | | | | | | | |
| 750 ÅNPB | 200 ÅTBADN + 3% NPB + 2% Blue-Green 2 | 350 ÅAlq | 7.4 | 8.3 | 0.104 (0.116) | 0.164 0.307 | 472 60 | −21 | 120 | 900 | 170 | 1,300 |
| Comparative Example 10: with Alq + Li ETL: Host BPNA: | | | | | | | | | | |
| 750 ÅNPB|400 ÅBPNA + 3% Blue-Green 2| 200 ÅAlq + 3.7% Li | 7.2 | 12.0 | 0.120 (0.101) | 0.175 0.430 | 480 64 | +15 | 100 | 1,300 | 80 | 550 |
| Inventive Example 10: NPB co-doping with Alq + Li ETL: Host BPNA: | | | | | | | | | | |
| 750 ÅNPB|400 ÅBPNA + 2% NPB + 3% Blue-Green 2 | 200 ÅAlq + 3.7% Li | 7.9 | 12.4 | 0.134 (0.122) | 0.164 0.392 | 480 60 | +5 | 230 | 1,600 | 120 | 550 |

Blue-green OLED data at 20 mA/cm² (unless otherwise noted): electroluminescence efficiency gain upon addition of less than 5% hole-trapping material to a blue-green light-emitting layer

TABLE 4

OLED data at 20 mA/cm² (unless otherwise noted): formation of charge-transfer complex and change in electroluminescent color upon addition of a hole-trapping material mTDATA having too low oxidation potential to the otherwise blue light-emitting layer (mTDATA has a low oxidation potential of 0.46 V in acetonitrile-toluene (1:1 vol.) and 0.37 V in $CH_2Cl_2$ vs. SCE).

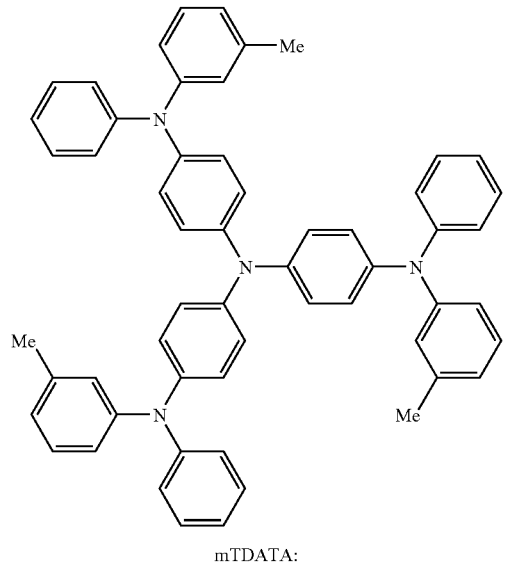

mTDATA:

| Cell configuration | Voltage, V | Efficiency, cd/A | Efficiency, W/A at 20 mA/cm² (at 0.5 mA/cm²) | $CIE_x$ $CIE_y$ | $\lambda_{max}$ FWHM, nm | W/A vs J (0.5-100) change, % | @40 mA/cm², RT, AC | | @20 mA²/cm, 70° C., AC | |
|---|---|---|---|---|---|---|---|---|---|---|
| | | | | | | | $T_{90\%}$, h | $T_{50\%}$, h | $T_{90\%}$, h | $T_{50\%}$, h |
| Comparative Example 11: Neat TBADN host (no dopants): | | | | | | | | | | |
| 750ÅNPB | 400ÅTBADN | 200|Alq | 7.6 | 1.27 | 0.040 (0.044) | 0.150 0.094 | 444 60 | −23 | 30 | 450 | — | — |
| Inventive Example 11a: addition of 1% mTDATA to an undoped TBADN: | | | | | | | | | | |
| 750ÅANPB | 400|ATBADN+ 1% mTDATA | 200ÅAlq | 9.5 | 1.47 | 0.023 (0.027) | 0.179 0.212 | 460 84 | −26 | 20 | 200 | — | — |

TABLE 4-continued

OLED data at 20 mA/cm² (unless otherwise noted): formation of charge-transfer complex and change in electroluminescent color upon addition of a hole-trapping material mTDATA having too low oxidation potential to the otherwise blue light-emitting layer (mTDATA has a low oxidation potential of 0.46 V in acetonitrile-toluene (1:1 vol.) and 0.37 V in CH$_2$Cl$_2$ vs. SCE).

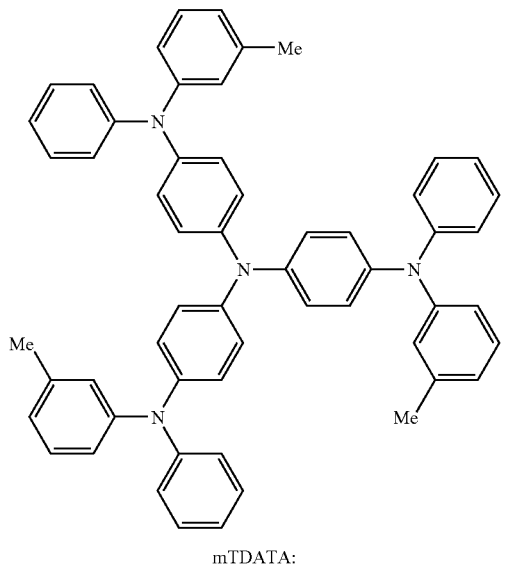

mTDATA:

| Cell configuration | Voltage, V | Efficiency, cd/A | Efficiency, W/A at 20 mA/cm² (at 0.5 mA/cm²) | CIE$_x$ CIE$_y$ | $\lambda_{max}$ FWHM, nm | W/A vs J (0.5-100) change, % | @40 mA/cm², RT, AC T$_{90\%}$, h | T$_{50\%}$, h | @20 mA²/cm, 70° C., AC T$_{90\%}$, h | T$_{50\%}$, h |
|---|---|---|---|---|---|---|---|---|---|---|
| Inventive Example 11b: addition of 4% mTDATA to an undoped TBADN: | | | | | | | | | | |
| 750ÅNPB │ 400ÅTBADN' 4% mTDATA │ 200ÅAlq | 10.01 | 1.52 | 0.015 (0.020) | 0.243 0.377 | 516 136 | −40 | 25 | 300 | — | — |
| Inventive Example 11c: addition of 15% mTDATA to an undoped TBADN: | | | | | | | | | | |
| 750ÅNPB │ 400ÅTBADN+ 15% mTDATA │ 200ÅAlq | 9.3 | 3.57 | 0.025 (0.027) | 0.349 0.554 | 536 96 | −33 | 50 | 800 | — | — |
| Inventive Example 11d: addition of 50% mTDATA to an undoped TBADN (Alq emission emanating ETL): | | | | | | | | | | |
| 750ÅNPB │ 400ÅTBADN+ 50% mTDATA │ 200ÅAlq | 6.0 | 1.16 | 0.008 (0.001) | 0.392 0.553 | 548 100 | — | 150 | 3,00 | — | — |

COMPARATIVE AND INVENTIVE EXAMPLES 11 AND 11a-d

Color-Changing Effect of a Hole-trapping Material mTDATA with too Low Oxidation Potential on Electroluminescence of Blue OLEDs

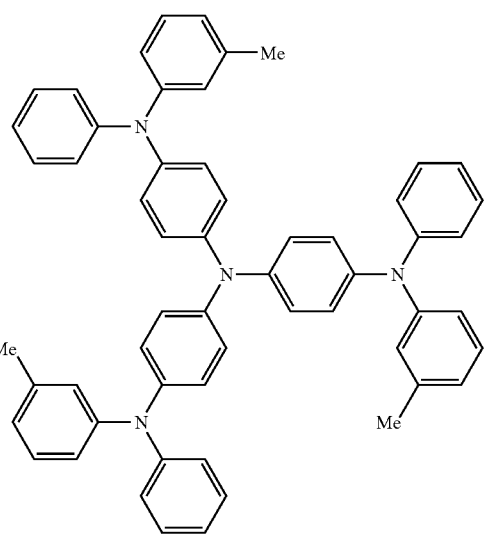

For layer thicknesses and concentrations of materials in multi-component layers of each device see Table 4. OLED devices were prepared similar to Examples 1-5 except that in place of the blue dopants the light-emitting layer contained 1-50% of mTDATA.

The EL characteristics of these devices are given in Table 4.

As can be seen from Table 4 and FIG. 4, inventive Examples 11a-d demonstrate addition of a hole-trapping material having too low oxidation potential results in the charge-transfer complex formation and, thus, device luminance color change. The color change is undesired for blue and blue-green OLEDs but still suitable for green and red OLEDs, to the light-emitting layers of which an appropriate dopant can be added to produce red, yellow, orange and red OLEDs having high EL efficiency and color purity.

The invention has been described in detail with particular reference to certain preferred embodiments thereof, but it will be understood that variations and modifications can be effected within the spirit and scope of the invention.

PARTS LIST 10 electrical conductors
100 OLED device
110 substrate
120 anode
130 EL medium
140 cathode
200 OLED device
210 substrate
220 anode
230 EL medium
231 hole-transport layer
232 light-emitting layer
233 electron-transport layer
240 cathode
300 OLED device
310 substrate
320 anode
330 EL medium
331 hole-injection layer
332 hole-transport layer
333 light-emitting layer
334 electron-transport layer
335 electron-injection layer
340 cathode

The invention claimed is:

1. An organic light-emitting device comprising a blue or blue-green light-emitting layer, including a host, a dopant and a hole-trapping material having an amine moiety, wherein the hole-trapping material is provided at 0.01% to less than 5% by volume relative to the light-emitting layer volume, has an oxidation potential that is selected so that it is less than the oxidation potential of the host in order to serve as a hole trap, has an oxidation potential that is selected so as to avoid formation of a certain charge transfer complex between the hole-trapping material and the host if the charge transfer complex causes a reduction in the electroluminescent efficiency of the dopant, and has an oxidation potential that is selected so as to avoid formation of an undesirable charge transfer complex between the hole-trapping material and the dopant wherein the oxidation potential for the hole-trapping material is in a range of from +0.6 V to +1.1 V, while the oxidation potential for the host is +1.2 V or higher vs. SCE.

2. The organic light-emitting device of claim 1 wherein the oxidation potential of the hole-trapping material is selected so that, if the charge transfer complex is formed between the hole-trapping material and the host, the charge transfer complex effectively donates electronic excitation energy to the dopant.

3. The organic light-emitting device of claim 1 wherein the host comprises an anthracene moiety.

4. The organic light-emitting device of claim 2 wherein the host includes an anthracene moiety.

5. The organic light-emitting device of claim 3 wherein the hole-trapping material comprises a tertiary aromatic amine

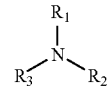

wherein:
substituents $R_1$ through $R_3$ are each individually hydrogen, silyl, alkyl of from 1 to 24 carbon atoms, substituted alkyl, aryl of from 5 to 30 carbon atoms, substituted aryl, fluorine, chlorine, heterocycle containing at least one nitrogen atom, at least one oxygen atom, at least one sulfur atom, at least one boron atom, at least one phosphorus atom, or at least one silicon atom, or any combination thereof.

6. The organic light-emitting device of claim 1 wherein the hole-trapping material comprises a tertiary aromatic amine

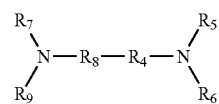

wherein:
substituents $R_4$ and $R_8$ are each individually and independently aryl, or substituted aryl of from 5 to 30 carbon atoms, heterocycle containing at least one nitrogen atom, at least one oxygen atom, at least one sulfur atom, at least one boron atom, at least one phosphorus atom, or at least one silicon atom, or any combination thereof; substituents $R_4$ and $R_8$ each or together ("$R_4$—$R_8$") representing an aryl group; and substituents $R_5$, $R_6$, $R_7$ or $R_9$ excluding $R_4$ and $R_8$ are each individually hydrogen, silyl, alkyl of from 1 to 24 carbon atoms, substituted alkyl, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof.

7. The organic light-emitting device of claim 5 wherein the aryl group comprises benzene, naphthalene, anthracene, tetracene, pyrene, perylene, chrysene, phenathrene, triphenylene, tetraphene, coronene, fluoranthene, pentaphene, ovalene, picene, anthanthrene or their homologs, their 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituted derivatives.

8. The organic light-emitting device of claim 6 wherein the aryl group comprises a benzene, naphthalene, anthracene, tetracene, pyrene, perylene, chrysene, phenathrene, triphenylene, tetraphene, coronene, fluoranthene, pentaphene, ovalene, picene, anthanthrene or their homologs, their 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituted derivatives.

9. The organic light-emitting device of claim 1 wherein the hole-trapping material includes N,N'-bis(1-naphthalenyl)-N, N'-diphenylbenzidine (NPB), N,N'-bis(1-naphthalenyl)-N, N'-bis(2-naphthalenyl)benzidine (TNB), N,N'-bis(3-methylphenyl)-N,N'-diphenylbenzidine (TPD), or N,N'-bis(N", N"'-diphenylaminonaphthalen-5-yl)-N,N'-diphenyl-1,5-diaminonaphthalene.

10. The organic light-emitting device of claim 3 wherein the anthracene derivative is represented by

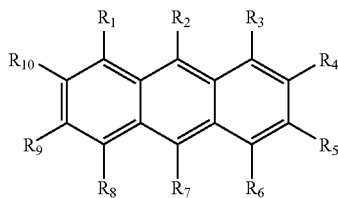

wherein:
substituents $R_2$ and $R_7$ are each individually and independently alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; and substituents $R_1$ through $R_{10}$ excluding $R_2$ and $R_7$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $R_1$ through $R_{10}$ substituents excluding $R_2$ and $R_7$ form an annelated benzo-, naphtho-, anthra-, phenanthro-, fluorantheno-, pyreno-, triphenyleno-, or peryleno-substituent or its alkyl or aryl substituted derivative; or any two adjacent $R_1$ through $R_{10}$ substituents excluding $R_2$ and $R_7$ form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

11. The organic light-emitting device of claim 10 wherein $R_2$ and $R_7$ independently represents a naphthyl or biphenyl group.

12. The organic light-emitting device of claim 10 wherein $R_2$ and $R_7$ independently represent a naphthyl or biphenyl group and $R_1$, $R_3$, $R_4$, $R_5$, $R_6$, $R_8$, $R_9$, or $R_{10}$ independently represents an aromatic group.

13. The organic light-emitting device of claim 3 wherein the anthracene host comprises 2-(1,1-dimethylethyl)-9,10-bis(2-naphthalenyl)-anthracene (TBADN), 9,10-bis(2-naphthalenyl)anthracene (ADN), 9,10-bis(6-cyano-2-naphthalenyl)anthracene (ADN(CN)$_2$), 9-biphenyl-10-(2-naphthalenyl)-anthracene (BPNA), and 9,10-bis(1-naphthalenyl)anthracene.

14. The organic light-emitting device of claim 1 wherein the host comprises an oxinoid compound wherein the oxinoid compound is represented by

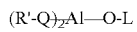

wherein:
Q in each occurrence represents a substituted 8-quinolinolato ligand;
R' represents an 8-quinolinolato ring substituent chosen to block sterically the attachment of more than two substituted 8-quinolinolato ligands to the aluminum atoms;
O-L is a arylolato ligand; and
L is a hydrocarbon group that includes an aryl moiety.

15. The organic light-emitting device of claim 14 wherein the oxinoid compound comprises Bis(8-quinolinol)magnesium (MgQ$_2$), 8-quinolinol lithium (LiQ), and bis(2-methyl-8-quinolinolato)(4-phenylphenolato)-aluminum(III) (BAlq).

16. The organic light-emitting device of claim 1 wherein the host comprises a fluorene compound.

17. The organic light-emitting device of claim 16 wherein the fluorene derivative is represented by

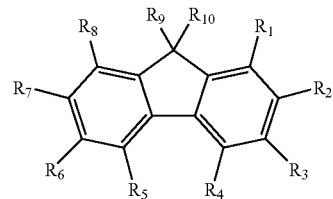

wherein:
substituents $R_1$ through $R_{10}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $R_1$ through $R_{10}$ substituents excluding $R_9$ and $R_{10}$ form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{10}$ substituents excluding $R_9$ and $R_{10}$ form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

18. The organic light-emitting device of claim 16 wherein the fluorene derivative is represented by

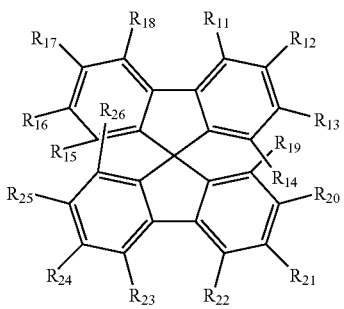

wherein:
substituents $R_{11}$ through $R_{26}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $R_{11}$ through $R_{26}$ substituents form an annelated benzo-, naphtho-, anthra-, phenanthro-, fluorantheno-, pyreno-, triphenyleno-, or peryleno-substituent or its alkyl or aryl substituted derivative; or any two $R_{11}$ through $R_{26}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

19. The organic light-emitting device of claim 1 wherein the host comprises a naphthacene compound.

20. The organic light-emitting device of claim 19 wherein the naphthacene derivative is represented by

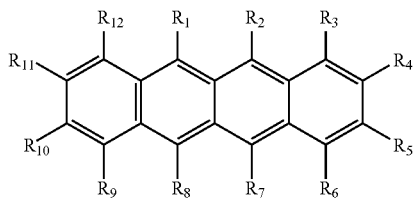

wherein:
substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

21. The organic light-emitting device of claim 1 wherein the host comprises a benzenoid compound.

22. The organic light-emitting device of claim 21 wherein the benzenoid derivative is represented by

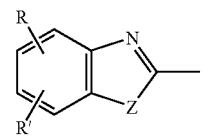

wherein:
Z is O, NR" or S; R and R', are individually hydrogen, alkyl of from 1 to 24 carbon atoms, aryl or hetero-atom substituted aryl of from 5 to 20 carbon atoms, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or atoms necessary to complete a fused aromatic ring; and R" is hydrogen; alkyl of from 1 to 24 carbon atoms; or aryl of from 5 to 20 carbon atoms.

23. The organic light-emitting device of claim 1 wherein the concentration range of the dopant is from 0.1% to 10% by volume relative to the light-emitting layer volume.

24. The organic light-emitting device of claim 1 wherein the concentration range of the dopant is from 0.5% to 5% by volume relative to the light-emitting layer volume.

25. The organic light-emitting device of claim 1 wherein the light-emitting layer includes a dopant compound represented by

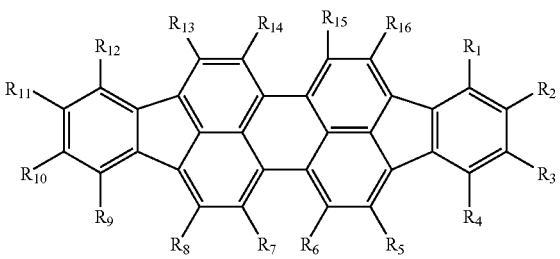

wherein:
substituents $R_1$ through $R_{16}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $R_1$ through $R_{16}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{16}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

26. The organic light-emitting device of claim 1 wherein the light-emitting layer includes a dopant compound represented by

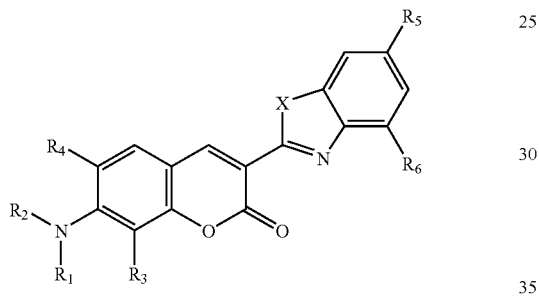

wherein:

X=S, O, or $NR_7$;

$R_1$ and $R_2$ are individually alkyl of from 1 to 20 carbon atoms, aryl or carbocyclic systems;

$R_3$ and $R_4$ are individually alkyl of from 1 to 10 carbon atoms, or a branched or unbranched 5 or 6 member substituent ring connecting with $R_1$ and $R_2$, respectively;

$R_5$ and $R_6$ are individually alkyl of from 1 to 20 carbon atoms, which are branched or unbranched; and $R_7$ is any alkyl or aryl group.

27. The organic light-emitting device of claim 1 wherein the light-emitting layer includes a dopant compound represented by

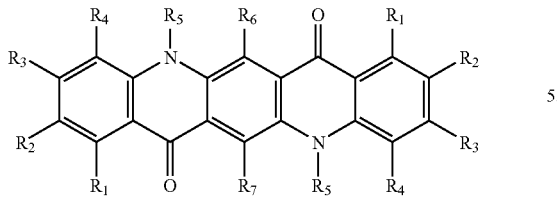

wherein:

substituents $R_1$ through $R_7$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $R_1$ through $R_4$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_4$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

28. The organic light-emitting device of claim 1 wherein the light-emitting layer includes a dopant compound represented by

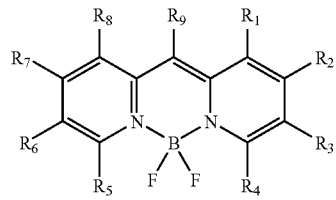

wherein:

substituents $R_1$ through $R_9$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $R_1$ through $R_9$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_9$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

29. The organic light-emitting device of claim 1 wherein the light-emitting layer includes a dopant compound represented by

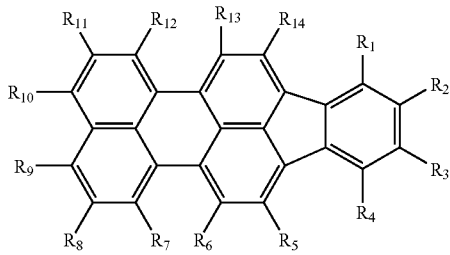

wherein:
  substituents $R_1$ through $R_{14}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $R_1$ through $R_{14}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{14}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

30. The organic light-emitting device of claim 1 wherein the light-emitting layer includes a dopant compound represented by

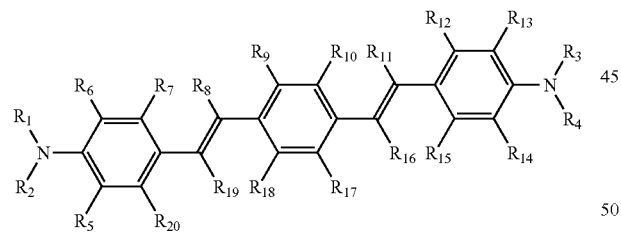

wherein:
  each double bond can be either E or Z independently of the other double bond; substituents $R_1$ through $R_4$ are each individually and independently alkyl of from 1 to 24 carbon atoms, aryl, or substituted aryl of from 5 to 30 carbon atoms, heterocycle containing at least one nitrogen atom, at least one oxygen atom, at least one sulfur atom, at least one boron atom, at least one phosphorus atom, or at least one silicon atom, or any combination thereof; and substituents $R_5$ through $R_{20}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $R_5$ through $R_{20}$ substituents form an annelated benzo-, naphtho-, anthra-, phenanthro-, fluorantheno-, pyreno-, triphenyleno-, or peryleno-substituent or its alkyl or aryl substituted derivative; or any two $R_5$ through $R_{20}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

31. The organic light-emitting device of claim 30 wherein the dopant compound comprises 4-(Diphenylamino)-4'-[4-(diphenylamino)styryl]-stilbene, 4-(Di-p-Tolylamino)-4'-[(di-p-tolylamino)styryl]stilbene (Blue-Green 2), 4,4'-[(2,5-Dimethoxy-1,4-phenylene)di-2,1-ethenediyl]bis[N,N-bis(4-methyl-phenyl)benzenamine, 4,4'-(1,4-Naphthalenediyldi-2,1-ethenediyl)bis[N,N-bis(4-methylphenyl)benzenamine, 3,3'-(1,4-Phenylenedi-2,1-ethenediyl)bis[9-(4-ethylphenyl)-9H-carbazole, or 4,4'-(1,4-Phenylenedi-2,1-ethenediyl)bis[N,N-diphenyl-1-naphthalenamine.

32. The organic light-emitting device of claim 1 wherein the light-emitting layer includes a dopant compound represented by wherein:
  substituents $R_1$ through $R_{12}$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof, or any two adjacent $R_1$ through $R_{12}$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_{12}$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

33. The organic light-emitting device of claim 32 wherein the dopant compound comprises Perylene, 2,5,8,11-Tetra-tert-butylperylene (TBP), 2,8-Di-tert-Butylperylene, Ovalene, Dibenzo[b,ghi]perylene, or Dibenzo[b,k]perylene.

34. The organic light-emitting device of claim 1 wherein the light-emitting layer includes a dopant compound represented by

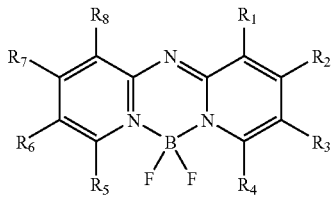

wherein:
substituents $R_1$ through $R_8$ are each individually hydrogen, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $R_1$ through $R_8$ substituents form an annelated benzo-, naphtho-, anthra-, phenanthro-, fluorantheno-, pyreno-, triphenyleno-, or peryleno-substituent or its alkyl or aryl substituted derivative; or any two $R_1$ through $R_8$ substituents form a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, or ace, or indeno substituent or their alkyl or aryl substituted derivative.

35. The organic light-emitting device of claim 34 wherein the dopant compound comprises Blue 2, ADPMB 1, or ADPMB 2.

36. The organic light-emitting device of claim 1 wherein the light-emitting layer includes a dopant compound represented by

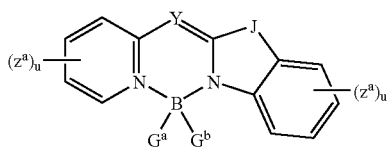

wherein:
substituents $Z^a$ are each individually fluoro, cyano, alkoxy, aryloxy, diarylamino, arylalkylamino, dialkylamino, trialkylsilyl, triarylsilyl, diarylalkylsilyl, dialkylarylsilyl, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $Z^a$ substituents form an annelated benzo-, naphtho-, anthra-, phenanthro-, fluorantheno-, pyreno-, triphenyleno-, or peryleno-substituent or its alkyl or aryl substituted derivative; each u independently is 0-4; Y represents N or C—X, wherein X represents hydrogen, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof; $G^a$ and $G^b$ represent independently halogen, alkyl, aryl, alkoxy, arylthio, sulfamoyl, acetamido, diarylamino, aryloxy, fluoro, or alkyl carboxylate; J represents O, S, Se, or N-A, wherein A represents alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof.

37. The organic light-emitting device of claim 1 wherein the light-emitting layer includes a dopant compound represented by

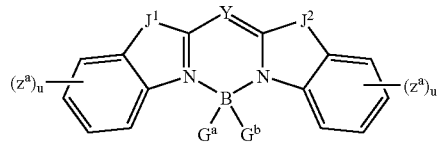

wherein:
substituents $Z^a$ are each individually fluoro, cyano, alkoxy, aryloxy, diarylamino, arylalkylamino, dialkylamino, trialkylsilyl, triarylsilyl, diarylalkylsilyl, dialkylarylsilyl, dicyanomethyl, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; or any two adjacent $Z^a$ substituents form an annelated benzo-, naphtho-, anthra-, phenanthro-, fluorantheno-, pyreno-, triphenyleno-, or peryleno-substituent or its alkyl or aryl substituted derivative; each u independently is 0-4; Y represents N or C—X, wherein X represents hydrogen, alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof; $G^a$ and $G^b$ represent independently halogen, alkyl, aryl, alkoxy, arylthio, sulfamoyl, acetamido, diarylamino, aryloxy, fluoro, or alkyl carboxylate; $J^1$ and $J^2$ independently represents O, S, Se, or N-A, wherein A represents alkyl of from 1 to 24 carbon atoms, alkenyl of from 1 to 24 carbon atoms, alkynyl of from 1 to 24 carbon atoms, aryl of from 5 to 30 carbon atoms, substituted aryl, heterocycle containing at least one nitrogen atom, at least one oxygen atom, at least one sulfur atom, at least one boron atom, at least one phosphorus atom, or at least one silicon atom, or any combination thereof.

38. The organic light-emitting device of claim 1 includes an electron-transport layer.

39. The organic light-emitting device of claim 38 wherein an electron-transport layer contains an alkali metal or alkali earth metal.

40. The organic light-emitting device of claim 39 wherein the alkali metal comprises lithium or cesium.

41. The organic light-emitting device of claim 1 further comprising a second light-emitting layer having a host for the second light-emitting layer and a dopant for the second light-emitting layer to provide an overall white light emission.

42. The organic light-emitting device of claim 41 wherein the host for the second light-emitting layer comprises an amine moiety and the dopant for the second light-emitting layer comprises a naphthacene moiety.

43. The organic light-emitting device of claim 41 wherein the host for the second light-emitting layer comprises an amine moiety and the dopant for the second light-emitting layer comprises a periflanthene moiety.

44. The organic light-emitting device of claim 41 wherein the host for the second light-emitting layer comprises at least two components and wherein the first host component for the second light-emitting layer includes an amine moiety and the second host component for the second light-emitting layer includes a naphthacene moiety and the dopant for the second light-emitting layer comprises a periflanthene moiety.

* * * * *